(12) United States Patent
Ting et al.

(10) Patent No.: US 11,978,714 B2
(45) Date of Patent: May 7, 2024

(54) ENCAPSULATED PACKAGE INCLUDING DEVICE DIES CONNECTED VIA INTERCONNECT DIE

(71) Applicant: Taiwan Semiconductor Manufacturing Co., Ltd., Hsinchu (TW)

(72) Inventors: Kuo-Chiang Ting, Hsinchu (TW); Chi-Hsi Wu, Hsinchu (TW); Shang-Yun Hou, Jubei (TW); Tu-Hao Yu, Hsinchu (TW); Chia-Hao Hsu, Hsinchu (TW); Ting-Yu Yeh, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/068,064

(22) Filed: Dec. 19, 2022

(65) Prior Publication Data

US 2023/0124804 A1 Apr. 20, 2023

Related U.S. Application Data

(63) Continuation of application No. 17/121,353, filed on Dec. 14, 2020, now Pat. No. 11,532,585, which is a (Continued)

(51) Int. Cl.
*H01L 23/00* (2006.01)
*H01L 21/48* (2006.01)
(Continued)

(52) U.S. Cl.
CPC .......... *H01L 24/24* (2013.01); *H01L 21/4853* (2013.01); *H01L 21/4857* (2013.01);
(Continued)

(58) Field of Classification Search
CPC . H01L 24/24; H01L 21/4853; H01L 21/4857; H01L 21/561; H01L 21/6835;
(Continued)

(56) References Cited

U.S. PATENT DOCUMENTS 7,402,901 B2 7/2008 Hatano et al.
9,281,339 B1 3/2016 Lin et al.
(Continued)

FOREIGN PATENT DOCUMENTS

CN 102867759 A 1/2013
CN 104037098 A 9/2014
(Continued)

*Primary Examiner* — John P. Dulka
(74) *Attorney, Agent, or Firm* — Slater Matsil, LLP

(57) ABSTRACT

A method includes bonding a first device die and a second device die to an interconnect die. The interconnect die includes a first portion over and bonded to the first device die, and a second portion over and bonded to the second device die. The interconnect die electrically connects the first device die to the second device die. The method further includes encapsulating the interconnect die in an encapsulating material, and forming a plurality of redistribution lines over the interconnect die.

18 Claims, 26 Drawing Sheets

Related U.S. Application Data continuation of application No. 15/813,538, filed on Nov. 15, 2017, now Pat. No. 10,867,954.

(51) Int. Cl.

| | | |
|---|---|---|
| *H01L 21/56* | (2006.01) | |
| *H01L 21/683* | (2006.01) | |
| *H01L 23/31* | (2006.01) | |
| *H01L 23/498* | (2006.01) | |
| *H01L 23/538* | (2006.01) | |
| *H01L 25/00* | (2006.01) | |
| *H01L 25/18* | (2023.01) | |

(52) U.S. Cl.
CPC ........ *H01L 21/561* (2013.01); *H01L 21/6835* (2013.01); *H01L 23/49816* (2013.01); *H01L 23/5383* (2013.01); *H01L 23/5385* (2013.01); *H01L 23/5386* (2013.01); *H01L 23/5389* (2013.01); *H01L 24/08* (2013.01); *H01L 24/19* (2013.01); *H01L 24/25* (2013.01); *H01L 24/32* (2013.01); *H01L 24/73* (2013.01); *H01L 25/18* (2013.01); *H01L 25/50* (2013.01); *H01L 21/563* (2013.01); *H01L 23/3128* (2013.01); *H01L 2221/68345* (2013.01); *H01L 2221/68359* (2013.01); *H01L 2224/08145* (2013.01); *H01L 2224/08235* (2013.01); *H01L 2224/08265* (2013.01); *H01L 2224/24011* (2013.01); *H01L 2224/24137* (2013.01); *H01L 2224/24146* (2013.01); *H01L 2224/25171* (2013.01); *H01L 2224/32227* (2013.01); *H01L 2224/73267* (2013.01); *H01L 2224/83001* (2013.01)

(58) Field of Classification Search
CPC ........... H01L 23/49816; H01L 23/5383; H01L 23/5385; H01L 23/5386; H01L 23/5389; H01L 24/08; H01L 24/19; H01L 24/25; H01L 24/32; H01L 24/73; H01L 25/18; H01L 25/50; H01L 21/563; H01L 23/3128; H01L 2221/68345; H01L 2221/68359; H01L 2224/08145; H01L 2224/08235; H01L 2224/08265; H01L 2224/24011; H01L 2224/24137; H01L 2224/24146; H01L 2224/25171; H01L 2224/32227; H01L 2224/73267; H01L 2224/83001; H01L 24/13; H01L 2224/04105; H01L 2224/12105; H01L 2224/16145; H01L 2224/32145; H01L 2224/32225; H01L 24/17; H01L 24/20; H01L 24/63; H01L 24/89; H01L 24/92; H01L 24/80; H01L 24/81; H01L 2224/13101; H01L 2224/16225; H01L 2224/16235; H01L 2224/73204; H01L 2224/73209; H01L 2224/80895; H01L 2224/81801; H01L 2224/81895; H01L 2224/92125; H01L 2924/14; H01L 2924/15192; H01L 2924/18161; H01L 2924/18162; H01L 2924/19011; H01L 2924/19104; H01L 25/0655; H01L 25/0657; H01L 23/29; H01L 23/481; H01L 23/485; H01L 24/30; H01L 25/0652; H01L 2924/00
See application file for complete search history.

(56) References Cited

U.S. PATENT DOCUMENTS

| | | | |
|---|---|---|---|
| 9,368,450 | B1 | 6/2016 | Gu et al. |
| 9,613,931 | B2 | 4/2017 | Lin et al. |
| 9,627,365 | B1 | 4/2017 | Yu et al. |
| 9,653,428 | B1 * | 5/2017 | Hiner ................... H01L 24/96 |
| 9,666,559 | B2 | 5/2017 | Wang et al. |
| 9,735,131 | B2 | 8/2017 | Su et al. |
| 10,049,894 | B2 | 8/2018 | Meng et al. |
| 10,163,833 | B2 | 12/2018 | Wang et al. |
| 10,490,506 | B2 | 11/2019 | Ma et al. |
| 2008/0138932 | A1 | 6/2008 | Hatano et al. |
| 2013/0062761 | A1 | 3/2013 | Lin et al. |
| 2013/0075936 | A1 | 3/2013 | Lin et al. |
| 2013/0292846 | A1 | 11/2013 | Lee et al. |
| 2015/0255416 | A1 | 9/2015 | Kim et al. |
| 2015/0262931 | A1 | 9/2015 | Vincent et al. |
| 2016/0093571 | A1 | 3/2016 | Kim et al. |
| 2017/0125379 | A1 | 5/2017 | Chen et al. |
| 2018/0190590 | A1 | 7/2018 | Ma et al. |
| 2018/0337129 | A1 | 11/2018 | Li et al. |

FOREIGN PATENT DOCUMENTS

| | | |
|---|---|---|
| CN | 104051399 A | 9/2014 |
| CN | 106098637 A | 11/2016 |
| CN | 106684048 A | 5/2017 |
| CN | 106684066 A | 5/2017 |
| CN | 107041137 A | 8/2017 |
| DE | 102016102108 A1 | 6/2017 |
| JP | 2017183714 A | 10/2017 |
| KR | 101210410 B1 | 12/2012 |
| KR | 20170051474 A | 5/2017 |
| KR | 20170111677 A | 10/2017 |
| WO | 2015130680 A1 | 9/2015 |

* cited by examiner

ENCAPSULATED PACKAGE INCLUDING DEVICE DIES CONNECTED VIA INTERCONNECT DIE

PRIORITY CLAIM AND CROSS-REFERENCE

This application is a continuation of U.S. patent application Ser. No. 17/121,353, entitled "Interconnect Chips," filed on Dec. 14, 2020, now U.S. Pat. No. 11,532,585, which is a continuation of U.S. patent application Ser. No. 15/813,538, entitled "Interconnect Chips," filed on Nov. 15, 2017, now U.S. Pat. No. 10,867,954 issued Oct. 15, 2020. This application is further related to U.S. patent application Ser. No. 16/575,573, entitled "Interconnect Chips," filed on Sep. 19, 2019, now U.S. Pat. No. 10,720,401 issued Jul. 21, 2020, which are incorporated herein by reference.

BACKGROUND

The packages of integrated circuits are becoming increasing complex, with more device dies packaged in the same package to achieve more functions. For example, a package may include a plurality of device dies such as processors and memory cubes bonded to a same interposer. The interposer may be formed based on a semiconductor substrate, with through-silicon vias formed in the semiconductor substrate to interconnect the features formed on the opposite sides of the interposer. A molding compound encapsulates the device dies therein. The package including the interposer and the device dies are further bonded to a package substrate. In addition, surface mount devices may also be bonded to the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
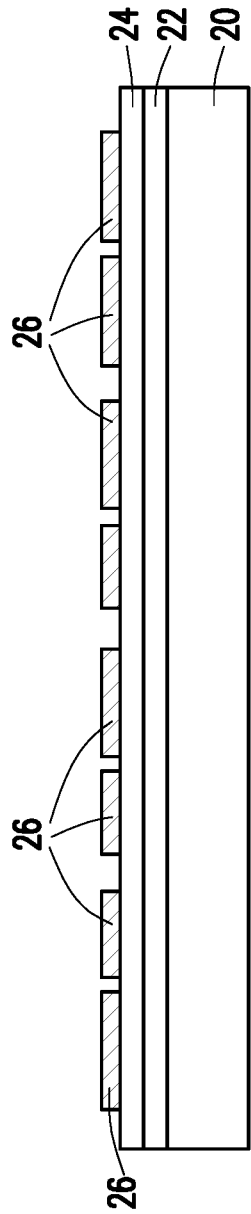
FIGS. 1 through 9 illustrate the cross-sectional views of intermediate stages in the formation of packages in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the same are provided in accordance with various exemplary embodiments. The intermediate stages of forming the package are illustrated in accordance with some embodiments. Some variations of some embodiments are discussed. Throughout the various views and illustrative embodiments, like reference numbers are used to designate like elements.

Figure 26:
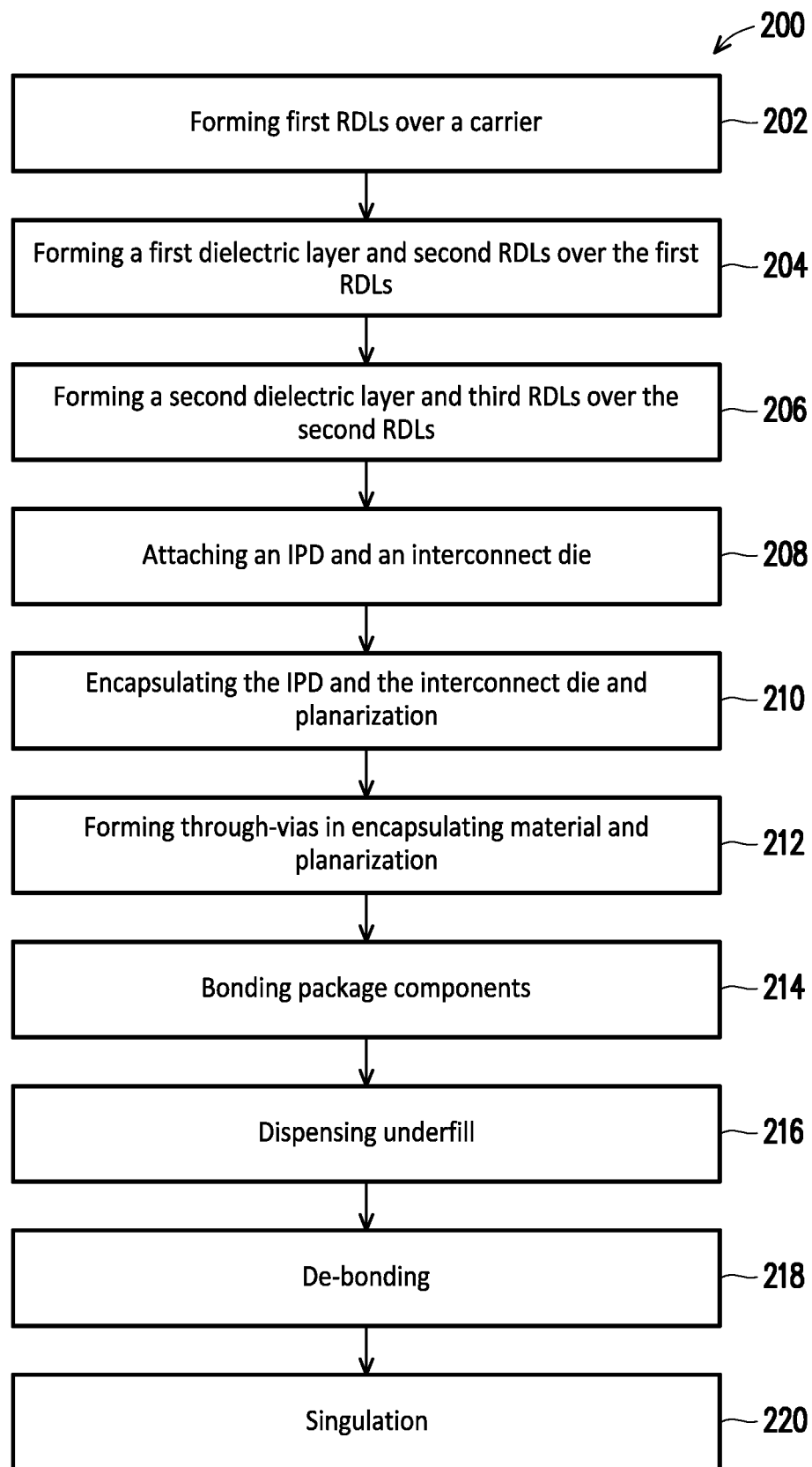
FIGS. 26, 27, and 28 illustrate process flows for forming packages in accordance with some embodiments.

FIGS. 1 through 9 illustrate the cross-sectional views of intermediate stages in the formation of a package in accordance with some embodiments of the present disclosure. The processes shown in FIGS. 1 through 9 are also referred to as a Redistribution Line (RDL) first (or RDL-first) process. The steps shown in FIGS. 1 through 9 are also reflected schematically in the process flow 200 shown in FIG. 26.

FIG. 1 illustrates carrier 20 and release layer 22 formed on carrier 20. Carrier 20 may be a glass carrier, a silicon wafer, an organic carrier, or the like. Carrier 20 may have a round top-view shape, and may have a size of a common silicon wafer. For example, carrier 20 may have an 8-inch diameter, a 12-inch diameter, or the like. Release layer 22 may be formed of a polymer-based material (such as a Light to Heat Conversion (LTHC) material), which may be removed along with carrier 20 from the overlying structures that will be formed in subsequent steps. In accordance with some embodiments of the present disclosure, release layer 22 is formed of an epoxy-based thermal-release material. Release layer 22 may be coated onto carrier 20. The top surface of release layer 22 is leveled and has a high degree of co-planarity.

Dielectric (buffer) layer 24 is formed on release layer 22. In accordance with some embodiments of the present disclosure, dielectric layer 24 is formed of a polymer, which may also be a photo-sensitive material such as polybenzoxazole (PBO), polyimide, benzocyclobutene (BCB), or the like, which may be easily patterned using a photo lithography process.

Redistribution Lines (RDLs) 26 are formed over dielectric layer 24. The respective step is referred to as step 202 in the process flow shown in FIG. 26. RDLs 26 may include some portions large enough for acting as the metal pads for bonding to solder regions or metal bumps. The formation of RDLs 26 may include forming a seed layer (not shown) over dielectric layer 24, forming a patterned mask (not shown) such as a photo resist over the seed layer, and then performing a metal plating on the exposed seed layer. The patterned mask and the portions of the seed layer previously covered by the patterned mask are then removed, leaving RDLs 26 as in FIG. 1. In accordance with some embodiments of the present disclosure, the seed layer includes a titanium layer and a copper layer over the titanium layer. The seed layer may be formed using, for example, Physical Vapor Deposition (PVD). The plating may be performed using, for example, electro-less plating.

Figure 2:
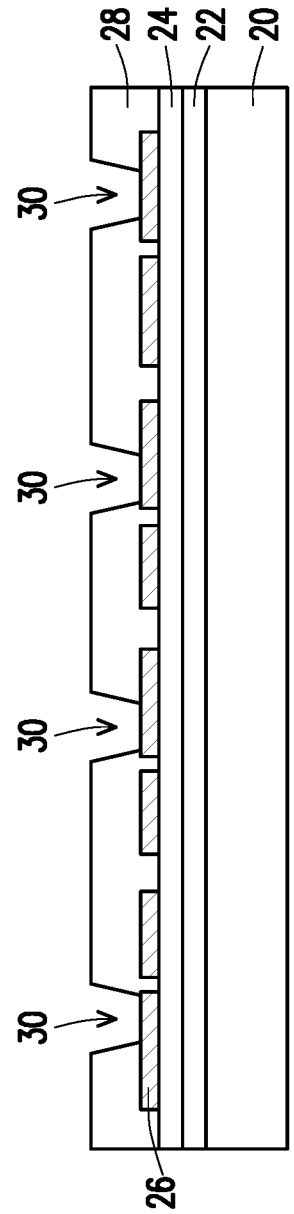

Referring to FIG. 2, dielectric layer 28 is formed on RDLs 26. The respective step is shown as step 204 in the process flow shown in FIG. 26. The bottom surface of dielectric layer 28 is in contact with the top surfaces of RDLs 26 and dielectric layer 24. In accordance with some embodiments of the present disclosure, dielectric layer 28 is formed of a polymer, which may be a photo-sensitive material such as PBO, polyimide, BCB, or the like. Alternatively, dielectric layer 28 may include a non-organic dielectric material such as silicon oxide, silicon nitride, silicon carbide, silicon oxynitride, or the like. Dielectric layer 28 is patterned to form openings 30 therein. Hence, some portions of RDLs 26 are exposed through openings 30.

Figure 3:
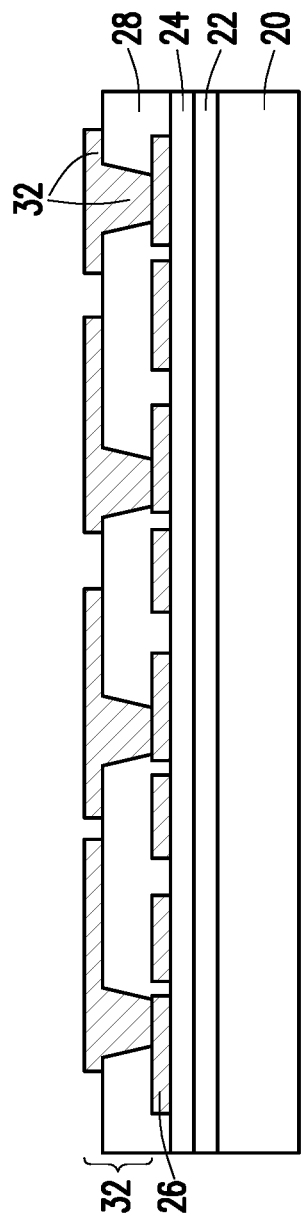

Next, referring to FIG. 3, RDLs 32 are formed to connect to RDLs 26. The respective step is also shown as step 204 in the process flow shown in FIG. 26. RDLs 32 include metal traces (metal lines) over dielectric layer 28. RDLs 32 also include vias extending into the openings in dielectric layer 28. RDLs 32 are also formed in a plating process, and each of the resulting RDLs 32 includes a seed layer (not shown) and a plated metallic material over the seed layer. The seed layer and the plated material may be formed of the same material or different materials. RDLs 32 may include a metal or a metal alloy including aluminum, copper, tungsten, or alloys thereof.

Figure 4:
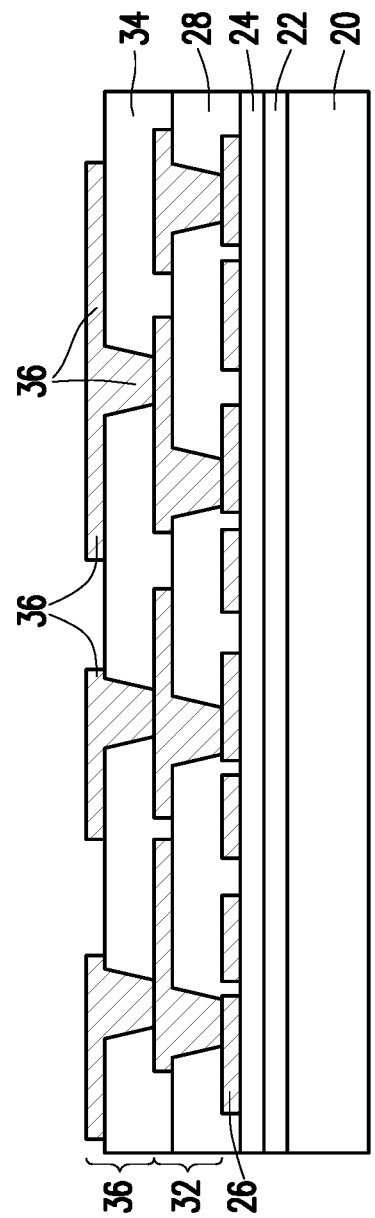

Referring to FIG. 4, dielectric layer 34 is formed over RDLs 32 and dielectric layer 28. The respective step is shown as step 206 in the process flow shown in FIG. 26. Dielectric layer 34 may be formed using a polymer, which may be selected from the same candidate materials as those of dielectric layer 28. For example, dielectric layer 34 may be formed of PBO, polyimide, BCB, or the like. Alternatively, dielectric layer 34 may include a non-organic dielectric material such as silicon oxide, silicon nitride, silicon carbide, silicon oxynitride, or the like.

FIG. 4 also illustrates the formation of RDLs 36, which are electrically connected to RDLs 32. The respective step is also shown as step 206 in the process flow shown in FIG. 26. The formation of RDLs 36 may adopt the methods and materials similar to those for forming RDLs 32. It is appreciated that although in the illustrative exemplary embodiments, two dielectric layers 28 and 34 and the respective RDLs 32 and 36 formed therein are discussed, fewer or more dielectric layers may be adopted, depending on the routing requirement and the requirement of using polymers for buffering stress. For example, there may be a single polymer layer or three, four, or more polymer layers. Due to process reasons, the via portions of RDLs 32 and 36 are tapered, with upper portion wider than the respective lower portions.

Figure 5:
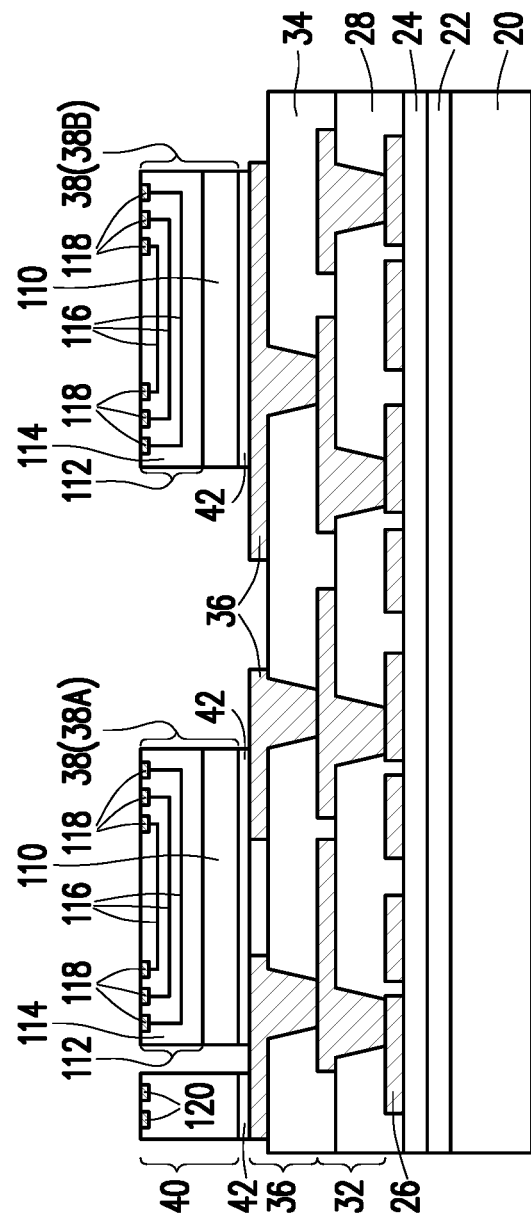

FIG. 5 illustrates the attachment of interconnect dies 38 and Integrated Passive Device (IPD) 40. The respective step is shown as step 208 in the process flow shown in FIG. 26. In accordance with some embodiments of the present disclosure, interconnect dies 38 and IPD 40 are attached to RDLs 36 through Die-Attach Film (DAFs, which are adhesive films) 42. Each DAF 42 may be adhered to one RDL 36, or may be attached to more than one RDLs 36, as illustrated in FIG. 5 as an example. In accordance with alternative embodiments, interconnect dies 38 and IPD 40 are attached to dielectric layer 34 through DAFs 42, with the DAFs 42 in contact with the top surfaces of dielectric layer 34. Interconnect dies 38 have the function of interconnecting the subsequently bonded device dies 50 (shown in FIG. 9). In accordance with some embodiments of the present disclosure, interconnect die 38 includes substrate 110, which may be a semiconductor substrate such as a silicon substrate. Substrate 110 may also be a dielectric substrate, which is formed of a dielectric material such as silicon oxide, silicon nitride, or the like. In accordance with some embodiments of the present disclosure, there is no through-via formed to penetrate through substrate 110, regardless of whether substrate 110 is formed of a semiconductor or a dielectric material.

In accordance with some embodiments of the present disclosure, interconnect dies 38 is free from active devices such as transistors and diodes. Interconnect die 38 may or may not be free from passive devices such as capacitors, transformers, inductors, resistors, and the like. In accordance with alternative embodiments of the present disclosure, interconnect dies 38 include some active devices and/or passive devices (not shown), and the active devices may be formed at the top surfaces of semiconductor substrates 110.

Interconnect dies 38 further include interconnect structures 112, which further includes dielectric layers 114 and metal lines and vias 116 in dielectric layers 114. Dielectric layers 114 may include Inter-Metal Dielectric (IMD) layers. In accordance with some embodiments of the present disclosure, some lower ones of dielectric layers 114 are formed of a low-k dielectric material having a dielectric constant (k-value) lower than about 3.0 or about 2.5. Dielectric layers 114 may be formed of Black Diamond (a registered trademark of Applied Materials), a carbon-containing low-k dielectric material, Hydrogen SilsesQuioxane (HSQ), MethylSilsesQuioxane (MSQ), or the like. In accordance with some embodiments of the present disclosure, the formation of dielectric layers 114 includes depositing a porogen-containing dielectric material and then performing a curing process to drive out the porogen, and hence the remaining dielectric layers 114 is porous. Etch stop layers (not shown), which may be formed of silicon carbide, silicon nitride, or the like, are formed between IMD layers 114, and are not shown for simplicity.

Metal lines and vias 116 are formed in dielectric layers 114. The formation process may include single damascene and dual damascene processes. In an exemplary single damascene process, trenches are first formed in one of dielectric layers 114, followed by filling the trenches with a conductive material. A planarization process such as a Chemical Mechanical Polish (CMP) process is then performed to remove the excess portions of the conductive material higher than the top surface of the corresponding dielectric layer, leaving metal lines in the trenches. In a dual damascene process, both trenches and via openings are formed in an IMD layer, with the via openings underlying and connected to the trenches. The conductive material is then filled into the trenches and the via openings to form metal lines and vias, respectively. The conductive material may include a diffusion barrier layer and a copper-containing metallic material over the diffusion barrier layer. The diffusion barrier layer may include titanium, titanium nitride, tantalum, tantalum nitride, or the like. Metal lines and vias 116 may also include some portions formed in passivation layers.

Interconnect dies 38 may further include passivation layers (also denoted as 114) over the low-k dielectric layers 114. The passivation layers have the function of isolating the underlying low-k dielectric layers (if any) from the adverse effect of detrimental chemicals and moisture. The passivation layers may be formed of non-low-k dielectric materials such as silicon oxide, silicon nitride, Undoped Silicate Glass (USG), or the like. There may be metal pads such as aluminum pads (which may be formed of aluminum copper, for example) in the passivation layers. Bond pads (or metal bumps) 118 are formed at the surface of interconnect dies 38.

IPD 40 may be a discrete device die, which may include a semiconductor substrate (not shown) and a passive device formed based on the semiconductor substrate. IPD 40 may include a single passive device and no other passive and active devices. The passive device may be a capacitor, an inductor, a resistor, or the like, and hence IPD 40 may be a two-terminal device. IPD 40 may also include a transformer, and hence may be a four-terminal device. Bond pads (or metal bumps) 120 are formed at the surface of IPD 40. IPD 40 and interconnect dies 38 are designed to have similar thicknesses.

Figure 6:
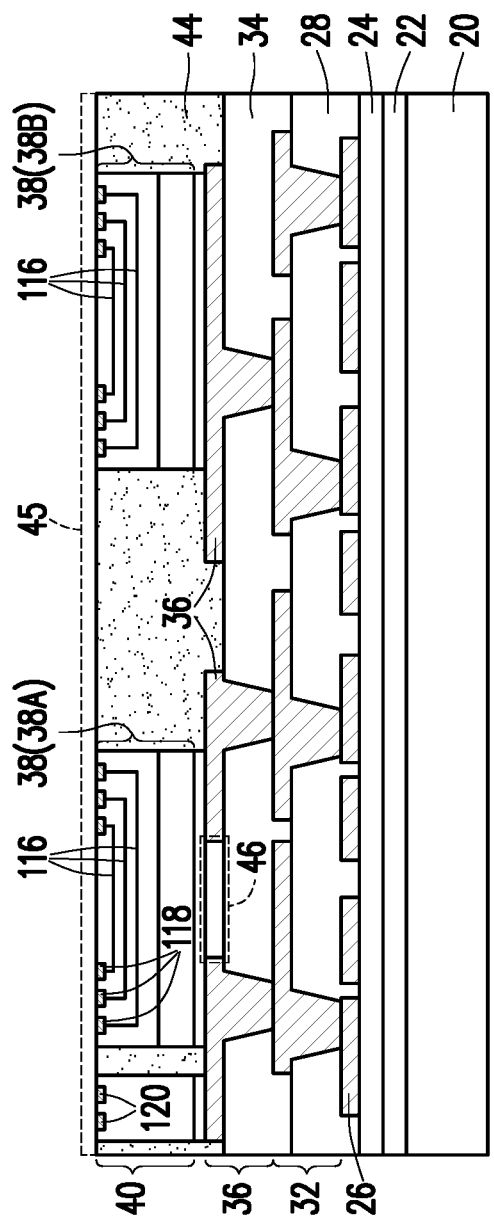

Referring to FIG. 6, IPD 40 and interconnect dies 38 are encapsulated in encapsulating material (encapsulant) 44, which may be formed of a molding compound, a molding underfill, or the like. The respective step is shown as step 210 in the process flow shown in FIG. 26. Encapsulating material 44 may include a base material, which may be a resin and/or a polymer, and filler particles in the base material. The filler particles may be formed of a dielectric material such as silica, aluminum oxide, and may be spherical particles. After the encapsulation, encapsulating material 44 covers IPD 40 and interconnect dies 38. A planarization process is then performed to remove excess portion of IPD 40 and interconnect dies 38, exposing bond pads 118 and 120. The planarization process may be a CMP process or a mechanical grinding process. In accordance with some embodiments of the present disclosure, encapsulating material 44 flows underlying IPD 40 and interconnect dies 38 to fill gaps. In accordance with some other embodiments, there may be some gaps left unfilled by encapsulating material 44. For example, FIG. 6 illustrates region 46, which may be filled, or may be left unfilled (partially or entirely) as an air gap.

In accordance with some embodiments of the present disclosure, inside the entire encapsulating material 44, there is no device die having active devices therein. For example, IPD 40 and interconnect dies 38 are free from active devices.

Figure 7:
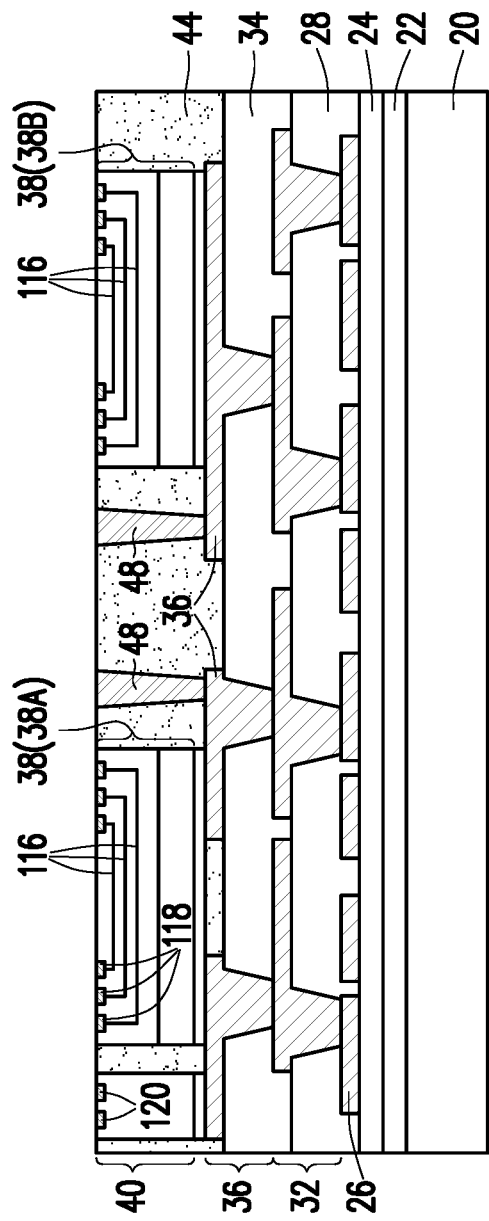

FIG. 7 illustrates the formation of through-vias 48, which penetrate through encapsulating material 44 to connect to the underlying RDLs 36. The respective step is shown as step 212 in the process flow shown in FIG. 26. The formation process includes etching encapsulating material 44 to form openings, in which some portions of RDLs 36 are exposed. The openings are then filled with a conductive material, followed by a planarization process to remove the excess portions of the conductive materials. The conductive material may be formed of copper, aluminum, tungsten, cobalt, or alloys of these metals. Through-vias 48 may or may not include conductive barrier layers formed of titanium nitride, tantalum nitride, titanium, tantalum, or the like. Due to process reasons, through-vias 48 may be tapered, with the upper portions wider than the respective lower portions in accordance with some embodiments of the present disclosure.

In accordance with alternative embodiments of the present disclosure, in the step shown in FIG. 6, when the planarization process is finished, bond pads 118 and 120 are not exposed, and are covered by a remaining layer of encapsulating material 44. Rather, bond pads 118 and 120 are exposed after the planarization process shown in FIG. 7. For example, FIG. 6 illustrates dashed line 45, which represents the top surface of encapsulating material 44 after the respective planarization process. Keeping bond pads 118 and 120 covered in the step shown in FIG. 6 may prevent the over-polishing of bond pads 118 and 120 caused by two planarization processes.

Figure 8:
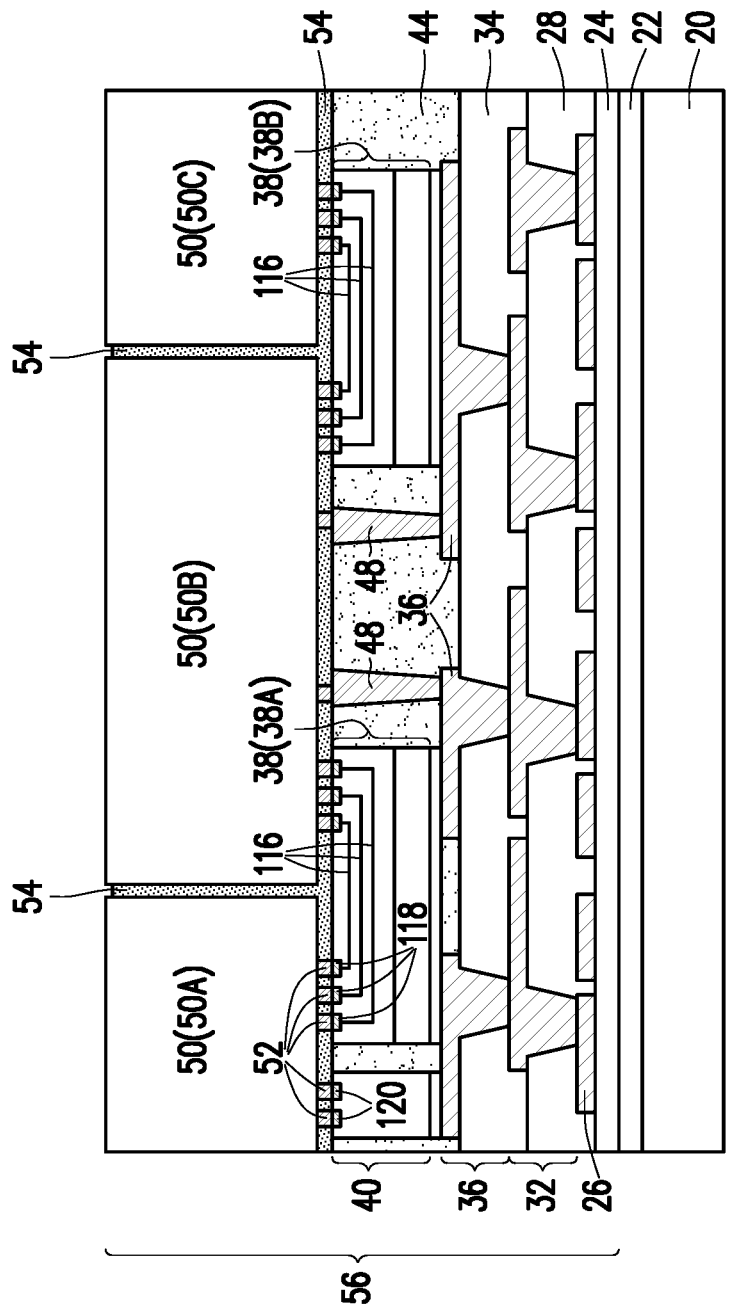

Referring to FIG. 8, package components (devices) 50, which may include 50A, 50B, and 50C, are bonded to IPD 40 and interconnect dies 38. The respective step is shown as step 214 in the process flow shown in FIG. 26. Bond pads 52 of package components are bonded to bond pads 118 and 120, and the bonding may be solder bonding or metal-to-metal direct bonding. Each of package components 50 may be (or include) a device die such as a logic die, which may be a Central Processing Unit (CPU) die, a Micro Control Unit (MCU) die, an input-output (IO) die, a BaseBand (BB) die, or an Application processor (AP) die. Package components 50 may also include memory dies such as a Dynamic Random Access Memory (DRAM) dies or a Static Random Access Memory (SRAM) dies. Package components 50 may also include packages, memory stacks, or the like.

In accordance with some embodiments of the present disclosure, interconnect dies 38 are used for the lateral connection of package components 50. For example, interconnect die 38A is bonded to both package components 50A and 50B, and is used for the electrical interconnection of package components 50A and 50B. Interconnect die 38B is bonded to both package components 50B and 50C, and is used for the electrical interconnection of package components 50B and 50C. The interconnection is achieved through metal lines and vias 116. Since interconnect dies 38 are formed using the processes for forming semiconductor wafers/dies, high-density interconnections may be formed due to the small width and small pitch of metal lines and vias 116. The pitches of metal lines and vias 116 may be much smaller than the pitches of RDLs 36 and 32. In addition, manufacturing cost is lowered by using pre-formed interconnect dies 38 for interconnection.

Further referring to FIG. 8, underfill 54 is dispensed. The respective step is shown as step 216 in the process flow shown in FIG. 26. Underfill 54 may fill the gaps between device dies 50 and the underlying encapsulating material 44, interconnect dies 38, and IPD 40. Underfill 54 may also fill the gaps between neighboring device dies 50. Also, the portions of underfill 54 between neighboring device dies 50 may have top surfaces lower than the top surfaces of package components 50. Throughout the description, the structure overlying release layer 22 is collectively referred to as composite wafer 56.

Figure 9:
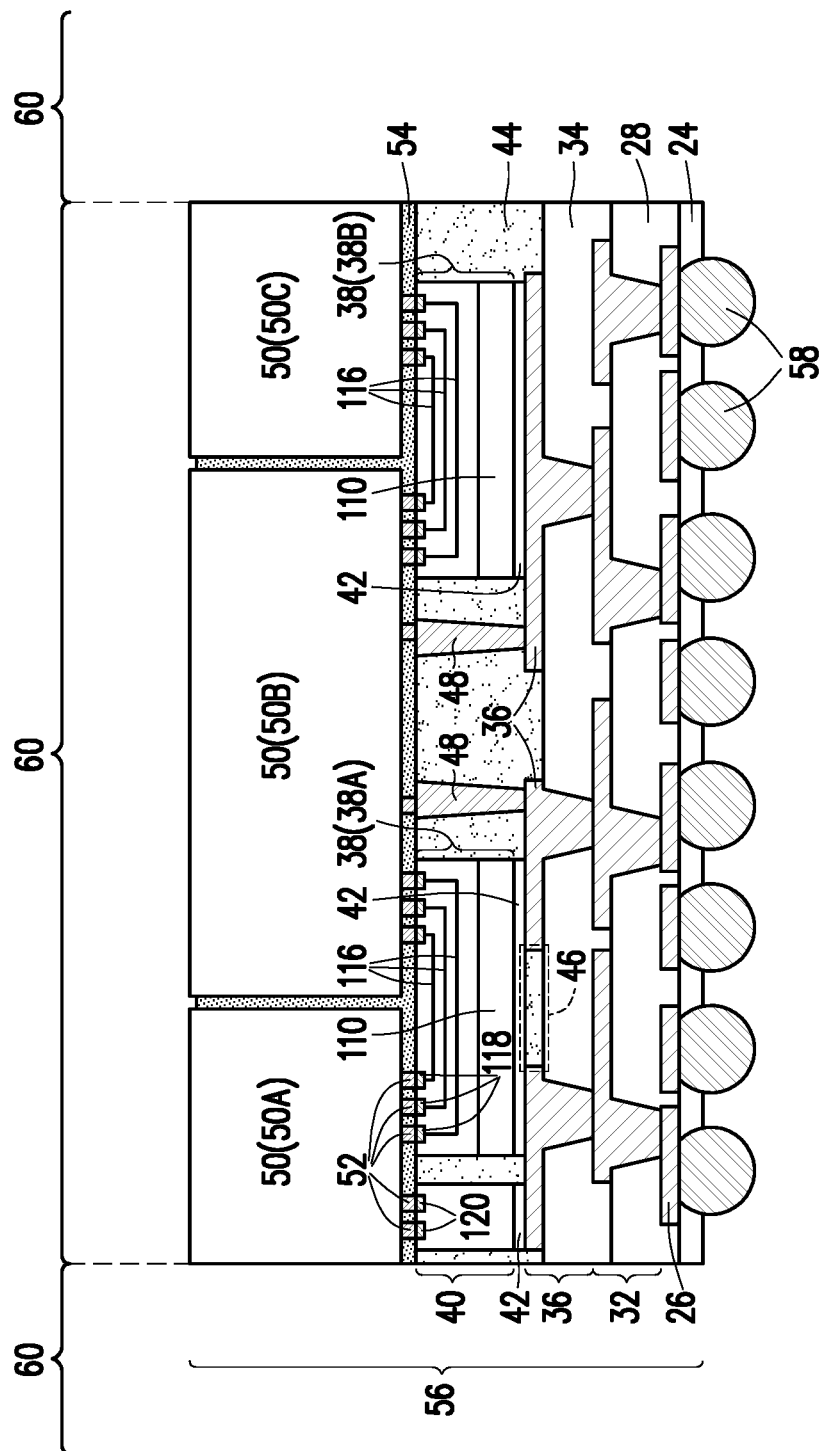
Figure 25:
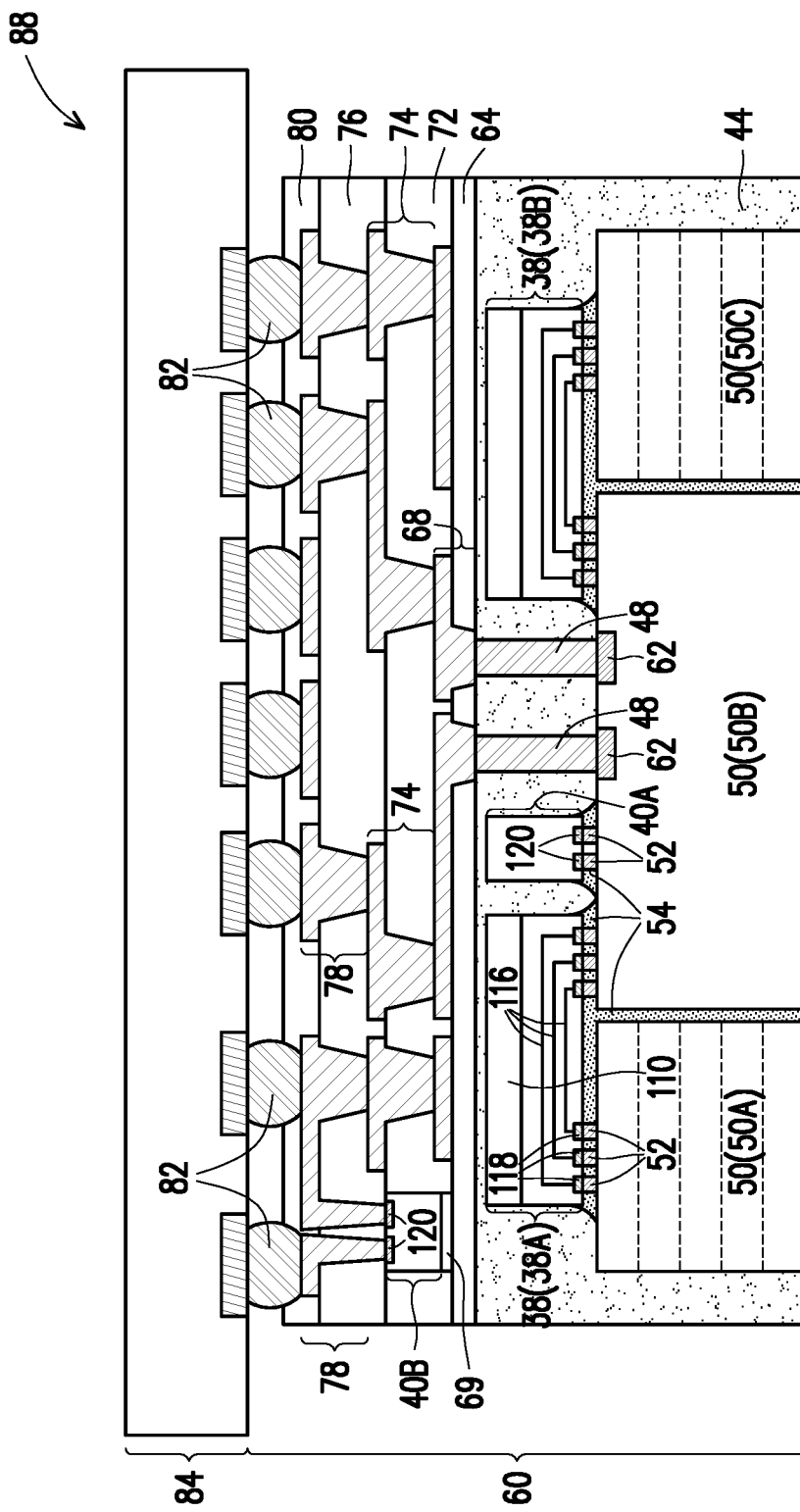
FIG. 25 illustrates a package including a package substrate or a printed circuit board in accordance with some embodiments.

Next, composite wafer 56 may be de-bonded from carrier 20, for example, by projecting light such as UV light or laser on release layer 22 to decompose release layer 22. The respective step is shown as step 218 in the process flow shown in FIG. 26. Carrier 20 and release layer 22 are removed from composite wafer 56. The resulting structure is shown in FIG. 9. In accordance with some embodiments of the present disclosure, buffer layer 24 is left on composite wafer 56, and openings are formed in buffer layer 24, for example, through laser drill. Solder region 58 are then formed to connect to RDLs 26 by extending into the openings in buffer layer 24, as shown in FIG. 9. Since composite wafer 56 is at wafer level, composite wafer 56 may be singulated (through a sawing process) into a plurality of packages 60, each having the structure shown in FIG. 9. The respective step is shown as step 220 in the process flow shown in FIG. 26. The resulting package 60 may be used for further bonding process, for example, as shown in FIG. 25.

Figure 27:
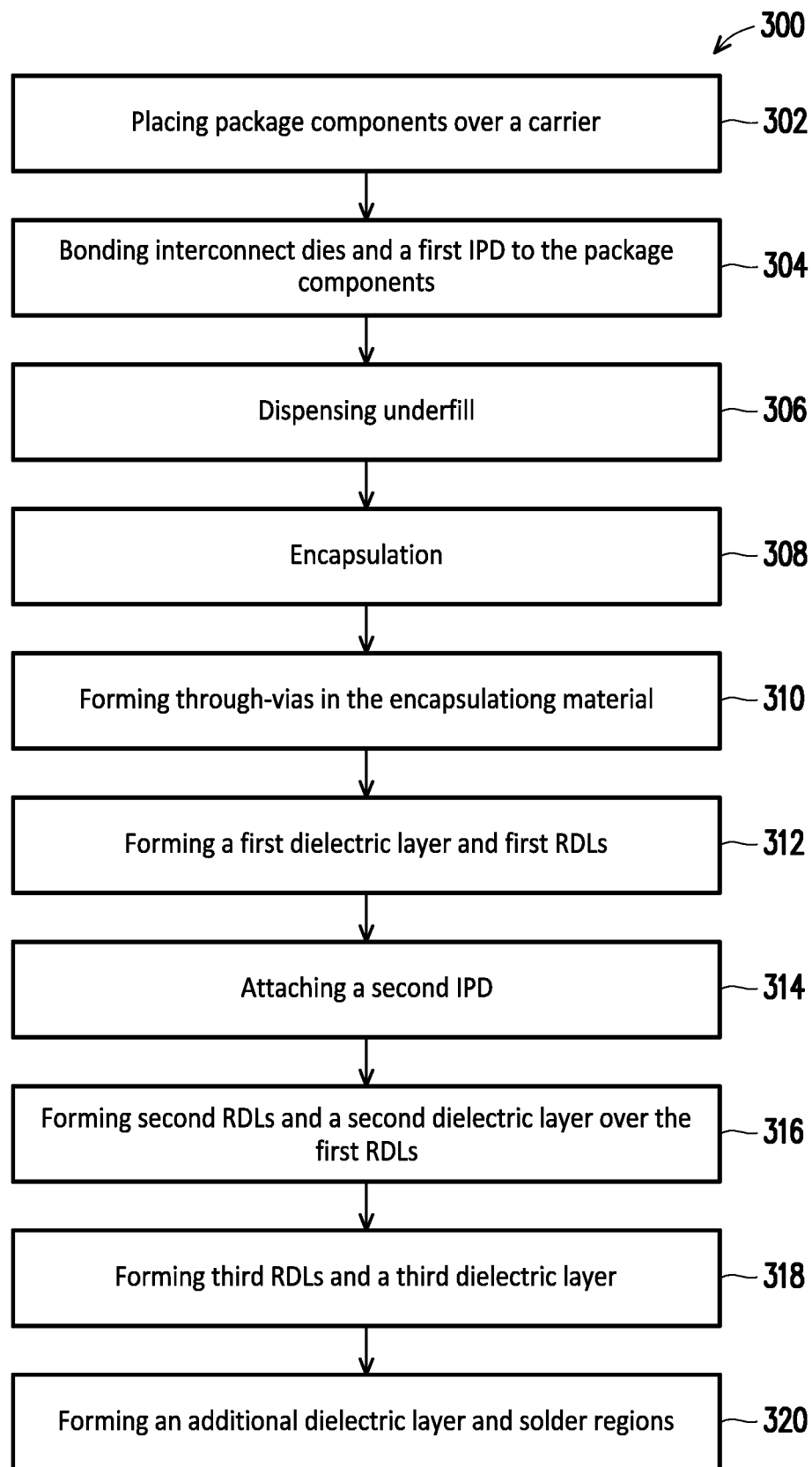

The processes shown in FIGS. 1 through 9 are referred to as an RDL-first process since RDLs 26, 32 and 36 are formed before the bonding/attachment of device dies 50. FIGS. 10 through 20 illustrate cross-sectional views of intermediate stages in the formation of a package in accordance with some embodiments of the present disclosure. These processes are referred to as die-first processes since device dies are bonded/attached before the formation of RDLs 26, 32 and 36. Unless specified otherwise, the materials and the formation methods of the components in these embodiments are similar to the like components, which are denoted by like reference numerals in the embodiments shown in FIGS. 1 through 9. The details regarding the formation process and the materials of the components shown in FIGS. 10 through 20 (and also in FIGS. 21 through 24) may thus be found in the discussion of the embodiments shown in FIGS. 1 through 9. The steps shown in FIGS. 10 through 20 are also reflected schematically in the process flow 300 shown in FIG. 27.

Figure 10:
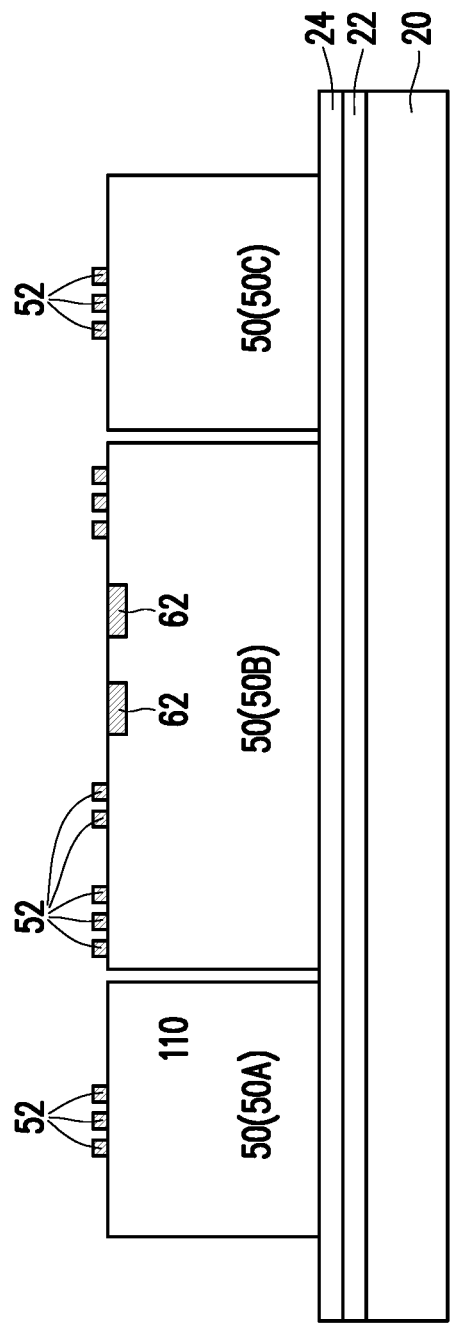
FIGS. 10 through 20 illustrate the cross-sectional views of intermediate stages in the formation of packages in accordance with some embodiments.

Referring to FIG. 10, package components 50 (including package components 50A, 50B, and 50C) are placed over carrier 20, and are attached to release layer 22. The respective step is shown as step 302 in the process flow shown in FIG. 27. Polymer buffer layer 24 may be or may not be formed. Package components 50 may include similar types of devices as discussed referring to FIG. 8. In accordance with some embodiments of the present disclosure, package components 50 include bond pads 52 and metal pads 62. Metal pads 62 may be formed at the same level as bond pads 52, or may be recessed than bond pads 52 as illustrated. Furthermore, metal pads 62 may be larger than bond pads 52. Both bond pads 52 and metal pads 62 are electrically connected to the integrated circuit devices/circuits (not shown) inside package components 50.

Figure 11:
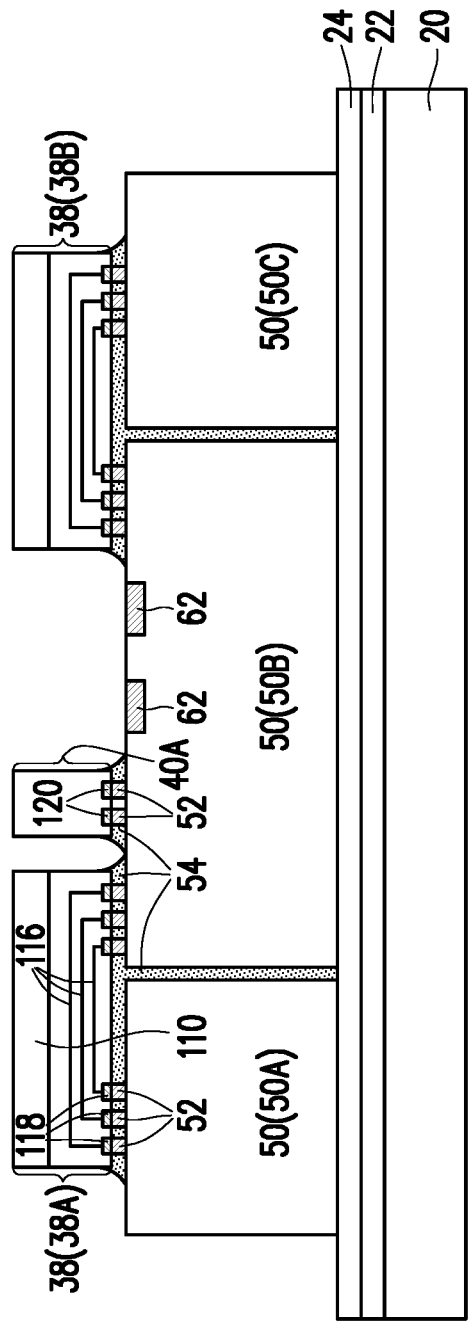

FIG. 11 illustrates the bonding of IPD 40A to package component 50B, interconnect die 38A to package components 50A and 50B, and interconnect die 38B to package components 50B and 50C. The respective step is shown as step 304 in the process flow shown in FIG. 27. Interconnect die 38A is used as the electrical interconnection between package components 50A and 50B. Interconnect die 38B is used as the electrical interconnection between package components 50B and 50C. The bonding may be through solder bonding, metal-to-metal direct bonding, or the like.

Underfill 54 is then dispensed to fill the gaps between IPD 40A, interconnect dies 38, and the respective underlying package components 50A, 50B, and 50C. The respective step is shown as step 306 in the process flow shown in FIG. 27. Furthermore, underfill 54 may include some portions flowing into the gaps between neighboring package components 50A, 50B, and 50C. These portions of underfill 54 may be overlapped by the overlying interconnect dies 38. In accordance with some embodiments of the present disclosure, the bottom surfaces of underfill 54 may (or may not) be coplanar with the bottom surfaces of package components 50A, 50B, and 50C.

Figure 12:
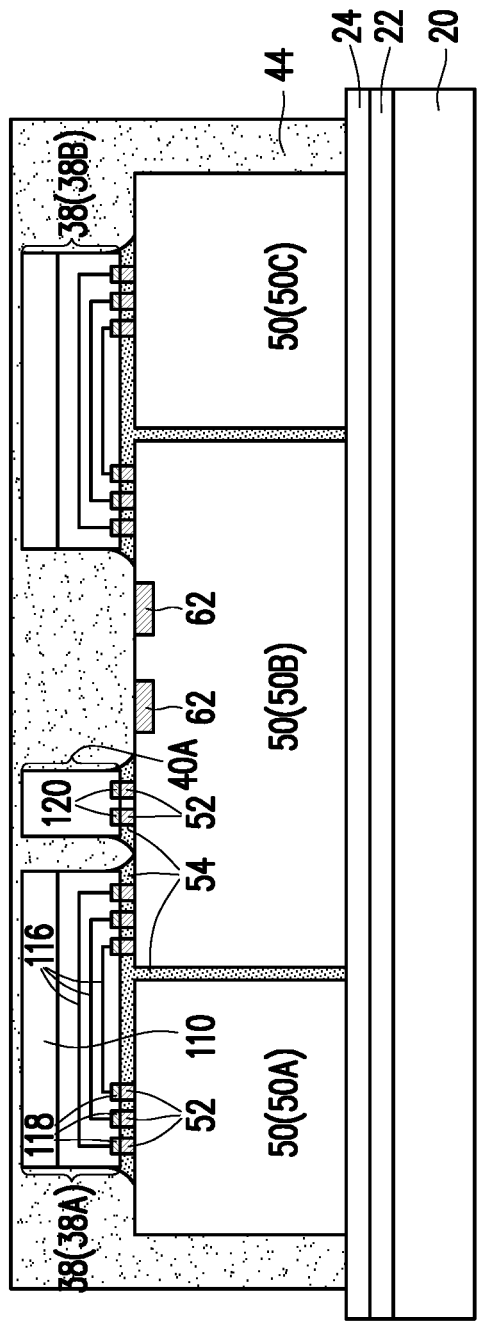

Referring to FIG. 12, encapsulating material 44 is dispensed and cured. The respective step is shown as step 308 in the process flow shown in FIG. 27. Package components 50A, 50B, and 50C, interconnect dies 38, and IPD 40A are thus encapsulated in encapsulating material 44. Encapsulating material 44 includes lower portions at the same level as, and encircling, package components 50A, 50B, and 50C, and upper portions higher than or at the same level as, and encircling, interconnect dies 38 and IPD 40A. It is appreciated that the packaging process is at wafer level, and hence encapsulating material 44 encapsulates a plurality of components identical to the components including package components 50A, 50B, and 50C, interconnect dies 38, and IPD 40A.

Figure 13:
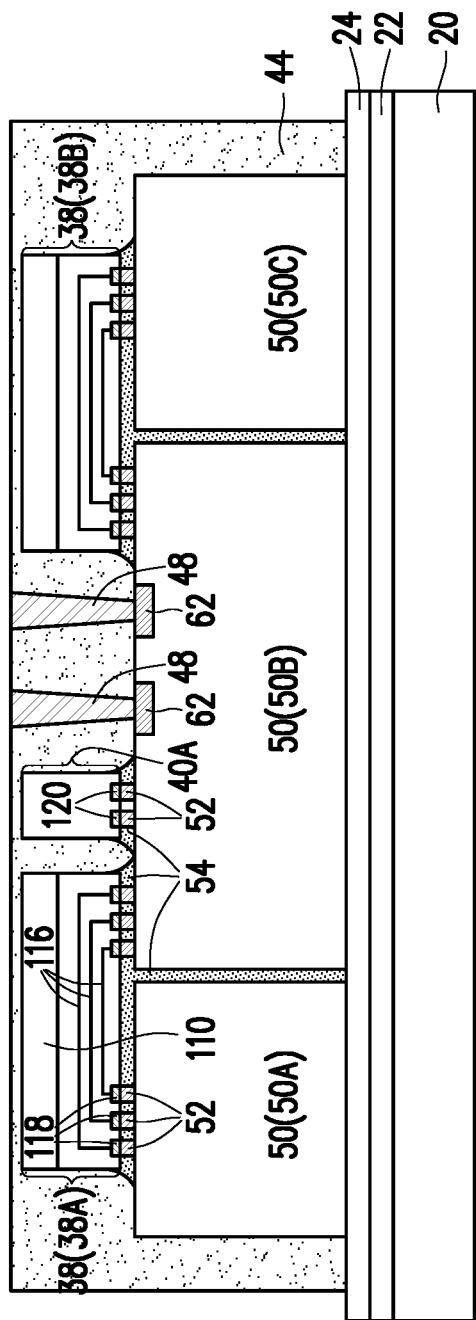

FIG. 13 illustrates the formation of through-vias 48, which penetrate through encapsulating material 44 to connect to the underlying metal pads 62. The respective step is shown as step 310 in the process flow shown in FIG. 27. The formation process includes etching encapsulating material 44 to form openings, in which some portions of metal pads 62 are exposed. The openings are then filled with a conductive material, followed by a planarization process to remove the excess portions of the conductive materials. The material and the structure of through-vias 48 may be similar to the through-vias 48 shown in FIG. 7, and the details are not repeated herein. Due to process reasons, through-vias 48 may be tapered, with the upper portions wider than the respective lower portions in accordance with some embodiments of the present disclosure.

Figure 14:
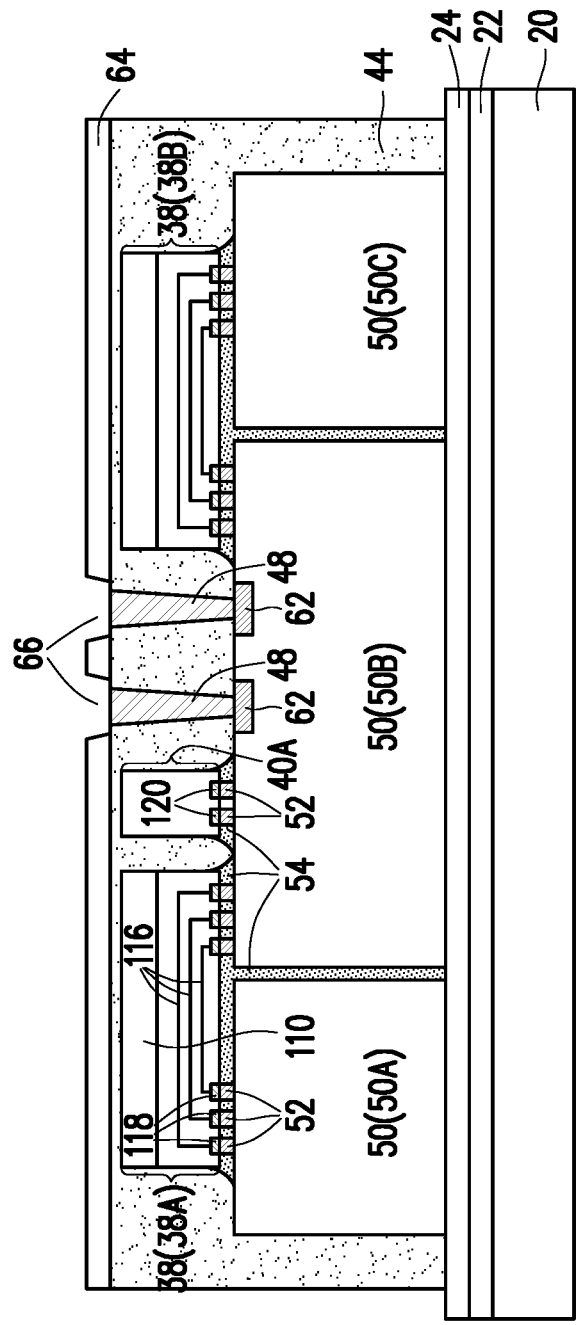

Referring to FIG. 14, dielectric layer 64 is formed, which may be formed of a polymer such as polyimide, PBO, or the like. The respective step is shown as step 312 in the process flow shown in FIG. 27. Alternatively, dielectric layer 64 may include a inorganic dielectric material such as silicon oxide, silicon nitride, silicon carbide, silicon oxynitride, or the like. Openings 66 are formed in dielectric layer 64, for example, through a photolithography process, which includes a light-exposure using a lithography mask, and then developing dielectric layer 64. Through-vias 48 are exposed to openings 66.

Figure 15:
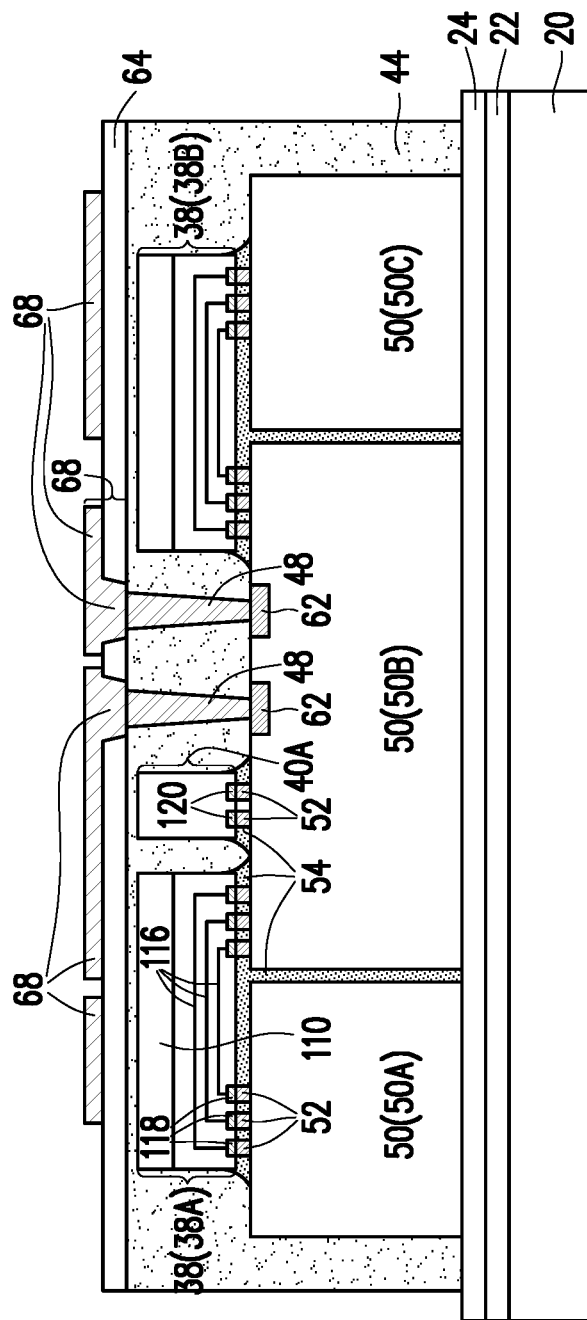

Next, referring to FIG. 15, RDLs 68 are formed to connect to through-vias 48. The respective step is also shown as step 312 in the process flow shown in FIG. 27. The material and the formation processes may be similar to the formation of RDLs 26, 32, and 36 as shown in FIGS. 1 through 4, and hence the details are not repeated herein. RDLs 68 include via portions extending into dielectric layer 64, and trace (line) portions overlying dielectric layer 64.

Figure 16:
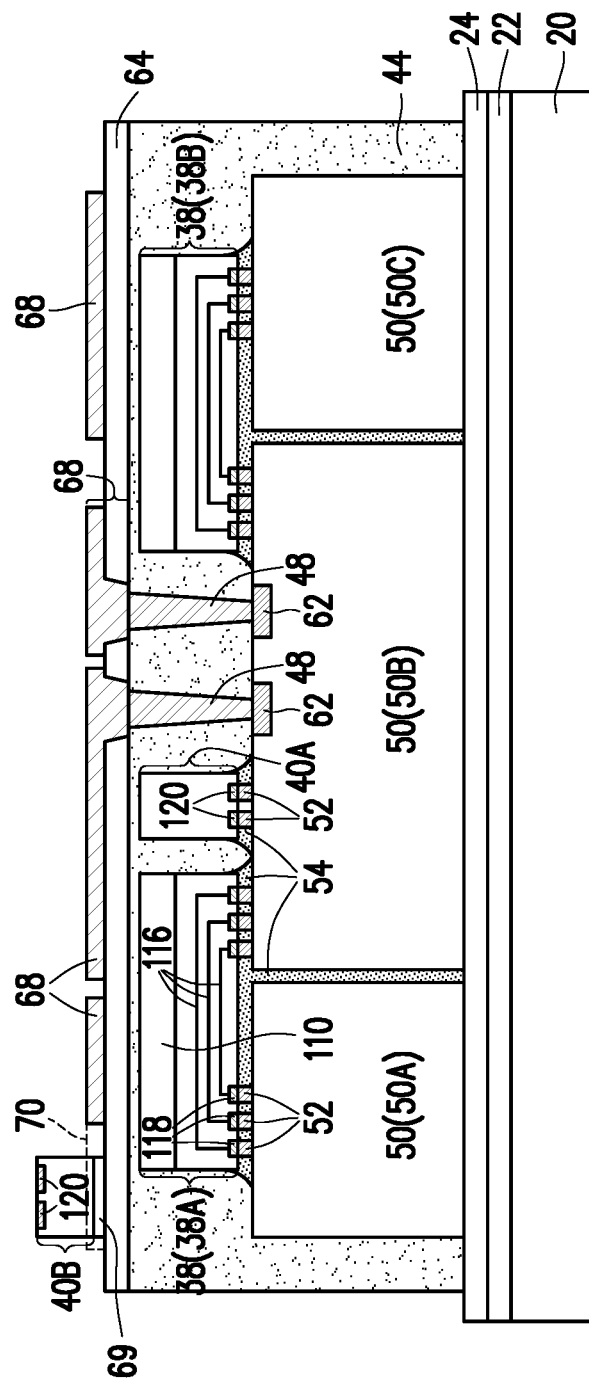

Referring to FIG. 16, IPD 40B is attached on dielectric layer 64, for example, through DAF 69. The respective step is shown as step 314 in the process flow shown in FIG. 27. In accordance with some embodiments of the present disclosure, rather than attaching IPD 40B to dielectric layer 64, IPD 40B may be adhered to the top surface(s) of RDLs 68. For example, dashed lines 70 schematically illustrate where one of RDLs 68 may extend, and IPD 40B and DAF 69 may be placed directly on the dashed portion 70 of RDLs 68. IPDs 40A and 40B may be the same as each other or different from each other.

Figure 17:
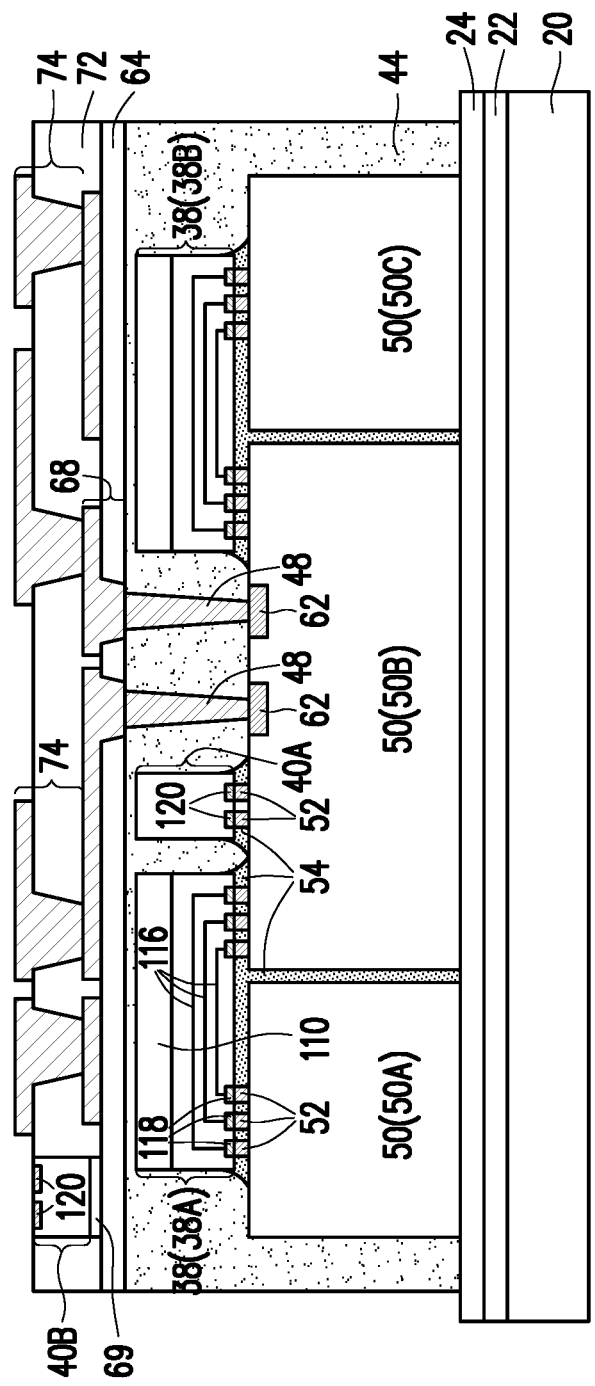

FIG. 17 illustrates the formation of dielectric layer 72, and RDLs 74 extending into dielectric layer 72. The respective step is also shown as step 316 in the process flow shown in FIG. 27. Dielectric layer 72 may be formed of a polymer such as polyimide, PBO, or the like, or may be formed of an inorganic material such as silicon oxide, silicon nitride, silicon carbide, silicon oxynitride, or the like. IPD 40B may be exposed out of dielectric layer 72, or may be buried in dielectric layer 72. Accordingly, bond pads 120 of IPD 40B may be exposed or covered. RDLs 74 are electrically connected to RDLs 68.

Figure 18:
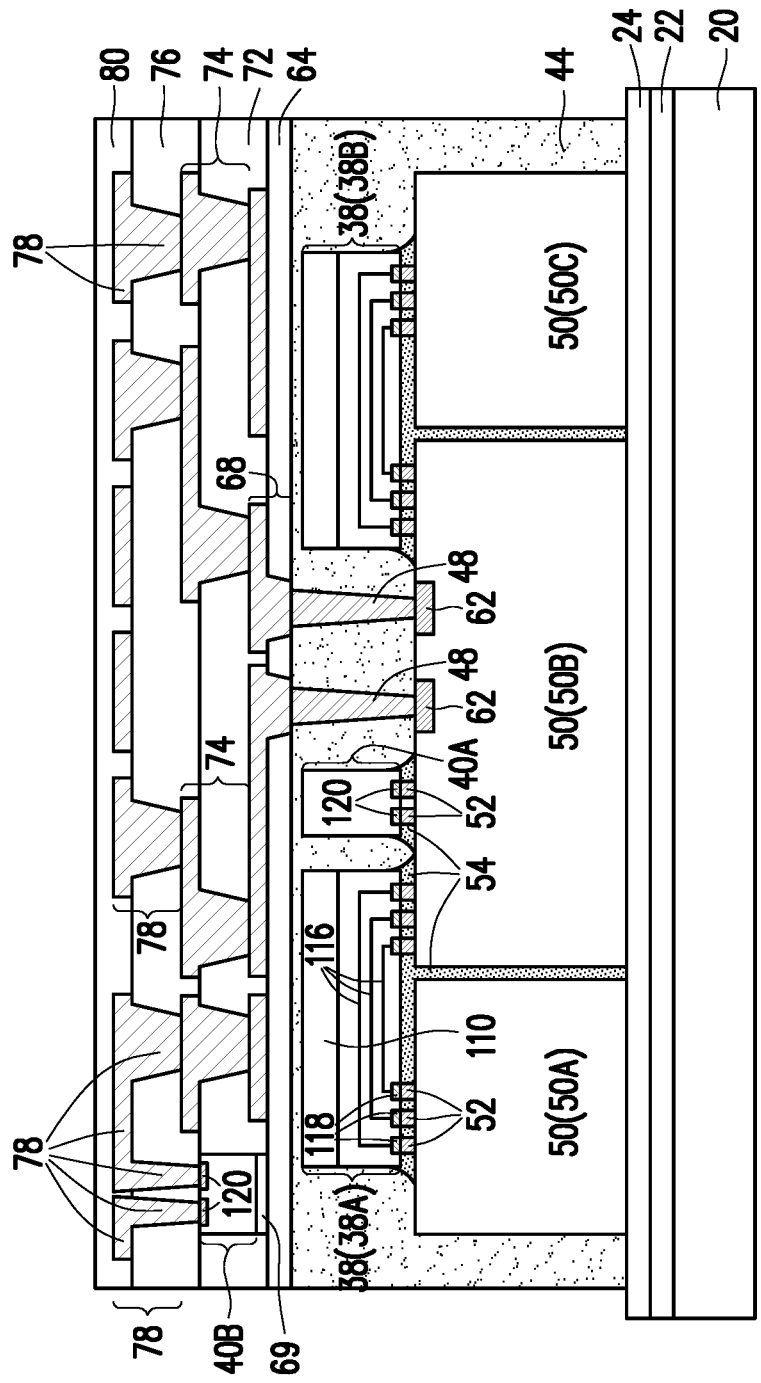

Next, referring to FIG. 18, dielectric layer 76 is formed to cover RDLs 74, followed by the formation of RDLs 78. The respective step is also shown as step 318 in the process flow shown in FIG. 27. Dielectric layer 76 may be formed of a material selected from the similar candidate materials for forming dielectric layers 64 and/or 72. RDLs 78 include metal traces (metal lines) over dielectric layer 76, and vias extending into the openings in dielectric layer 76. RDLs 78 may be formed in a plating process, and each of the resulting RDLs 78 may include a seed layer (not shown) and a plated metallic material over the seed layer.

The via portions of RDLs 78 may also include some portions connected to bond pads 120 of IPD 40B. Accordingly, IPD 40B is electrically connected to RDLs 78. In accordance with some embodiments in which dielectric layer 72 includes a top surface layer covering IPD 40B, the vias in RDLs 78 penetrate through dielectric layer 76 and further extend into the top surface layer of dielectric layer 72 to contact bond pads 120.

Next, dielectric layer 80 is formed over RDLs 78. The respective step is shown as step 320 in the process flow shown in FIG. 27. Dielectric layer 80 may be formed using a polymer, and may be selected from the same candidate materials as those of dielectric layers 64, 72, and 76. For example, dielectric layer 80 may be formed of PBO, polyimide, BCB, or the like. Alternatively, dielectric layer 80 may include an inorganic dielectric material such as silicon oxide, silicon nitride, silicon carbide, silicon oxynitride, or the like.

Figure 19:
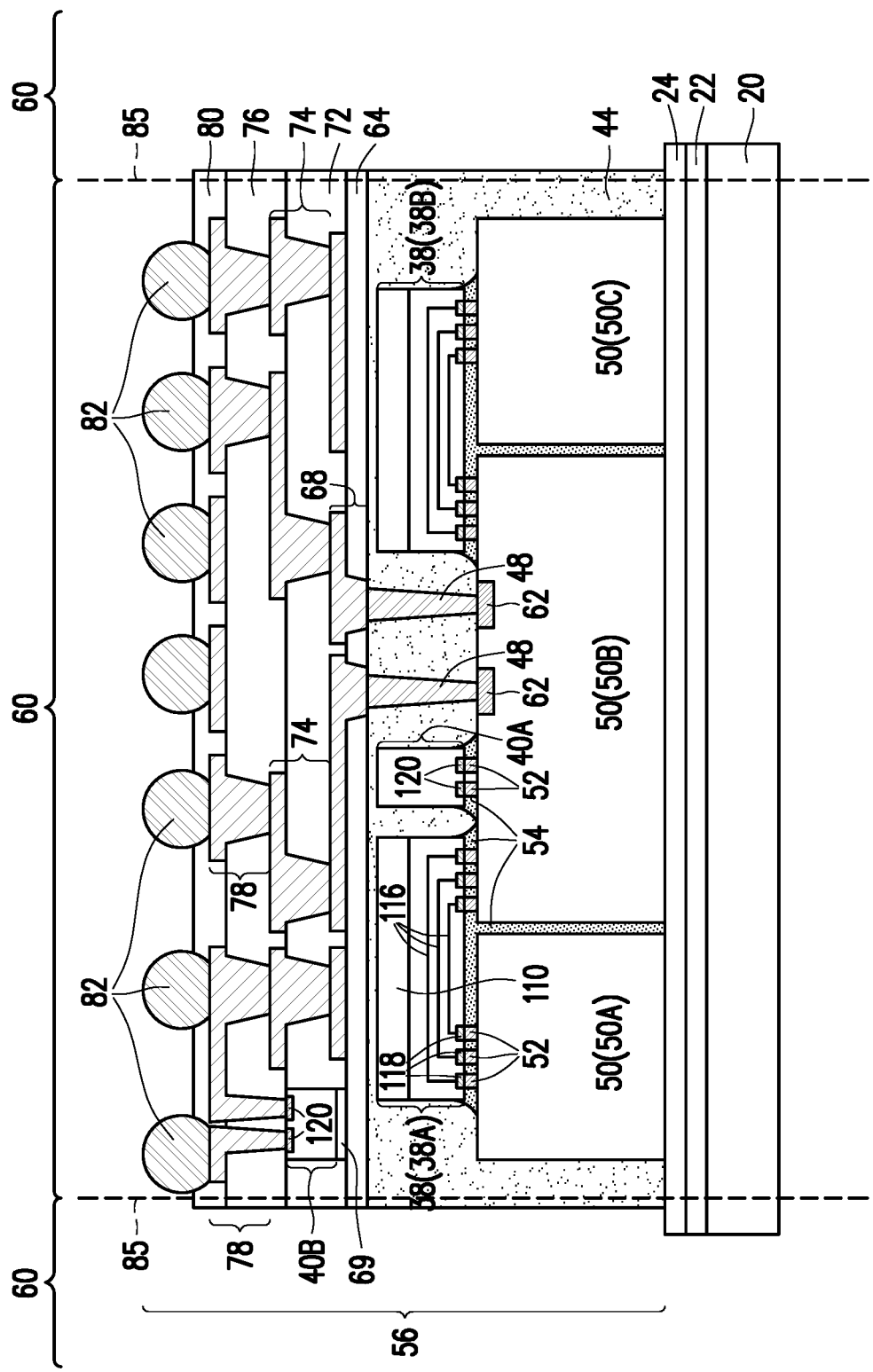
Figure 20:
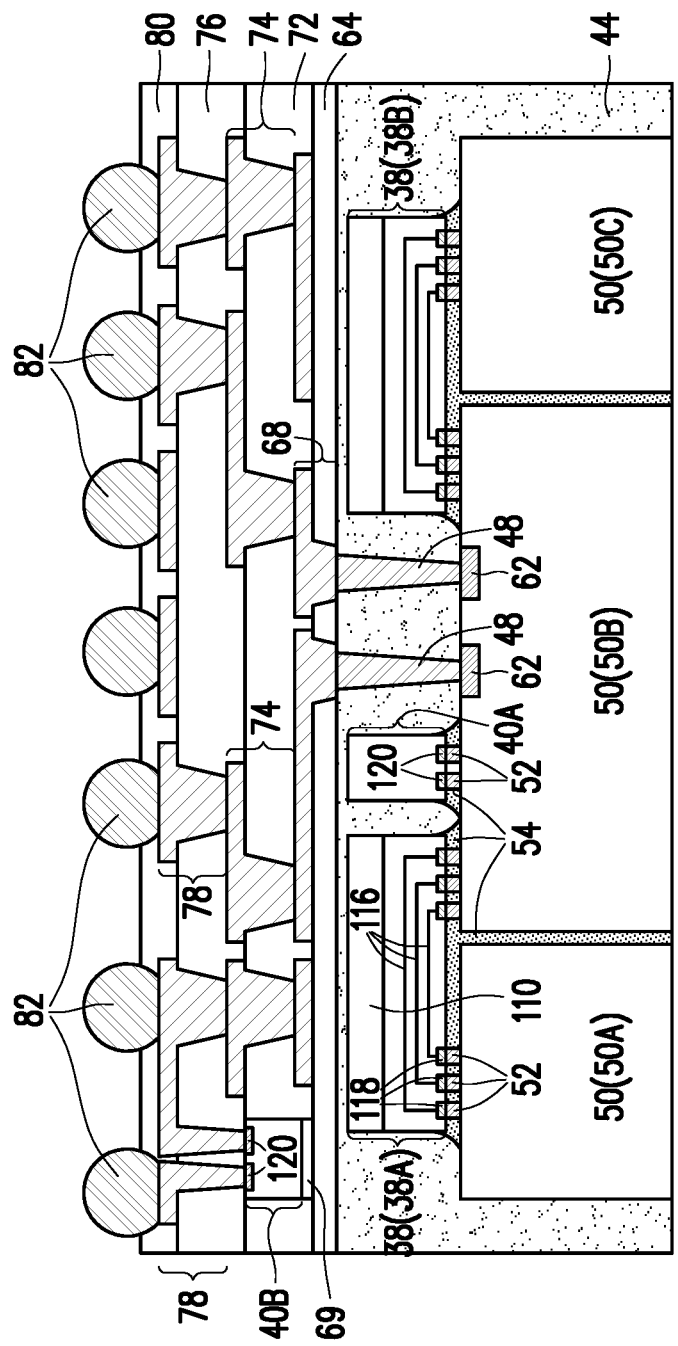

FIG. 19 illustrates the formation of solder regions 82. The respective step is also shown as step 320 in the process flow shown in FIG. 27. The formation may include forming openings in dielectric layer 80, for example, through laser drill. Solder regions 82 are then formed to connect to RDLs 78. The resulting structure overlying release layer 22 is referred to as composite wafer 56. In a subsequent step, composite wafer 56 is de-bonded from carrier 20. Next, composite wafer 56 is singulated by sawing through scribe lines 85, so that a plurality of packages 60 is formed. FIG. 20 illustrates a resulting package 60.

Figure 28:
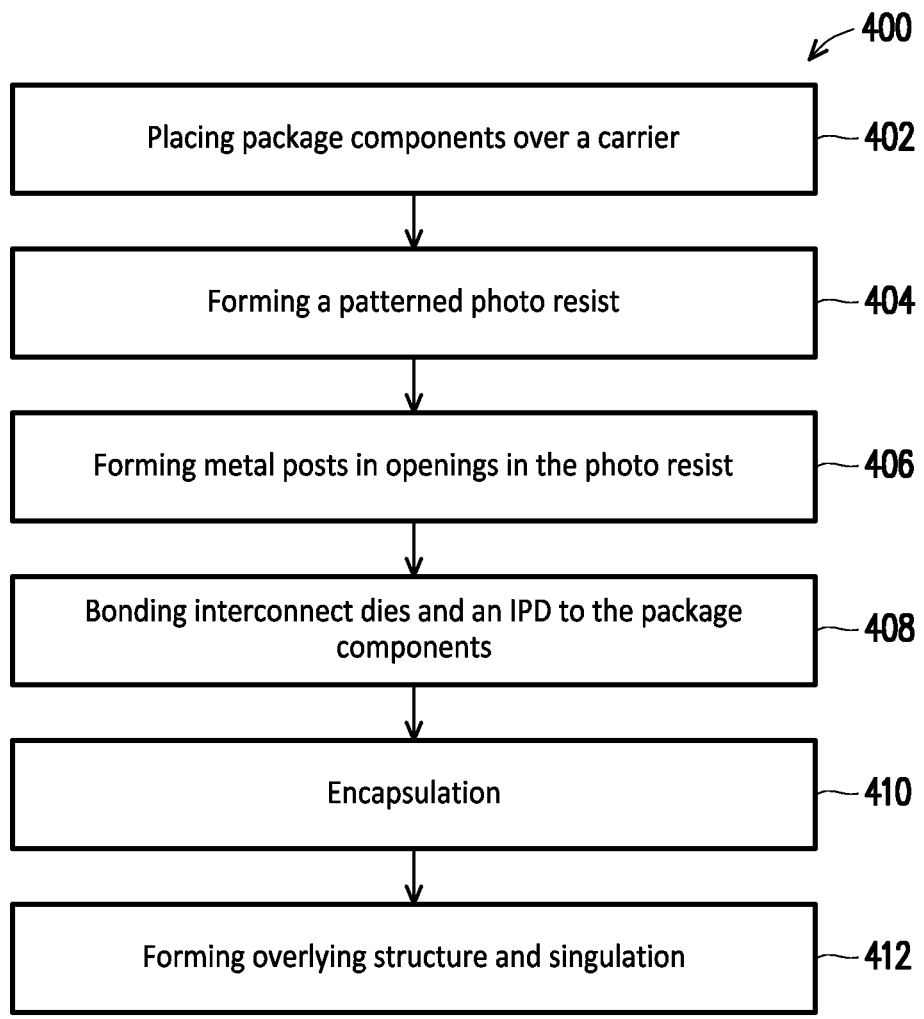

FIGS. 21 through 24 illustrate cross-sectional views of intermediate stages in the formation of a package in accordance with some embodiments of the present disclosure. These processes are also die-first processes since device dies are bonded/attached before the formation of RDLs. The steps shown in FIGS. 21 through 24 are also reflected schematically in the process flow 400 as shown in FIG. 28. The processes are similar to the processes shown in FIGS. 10 through 20, except through-vias 48 are grown from metal pads before encapsulating materials is formed, rather than forming encapsulating material first, and then forming through-vias 48 in the openings in encapsulating material 44 (as shown in FIGS. 12 and 13).

Figure 21:
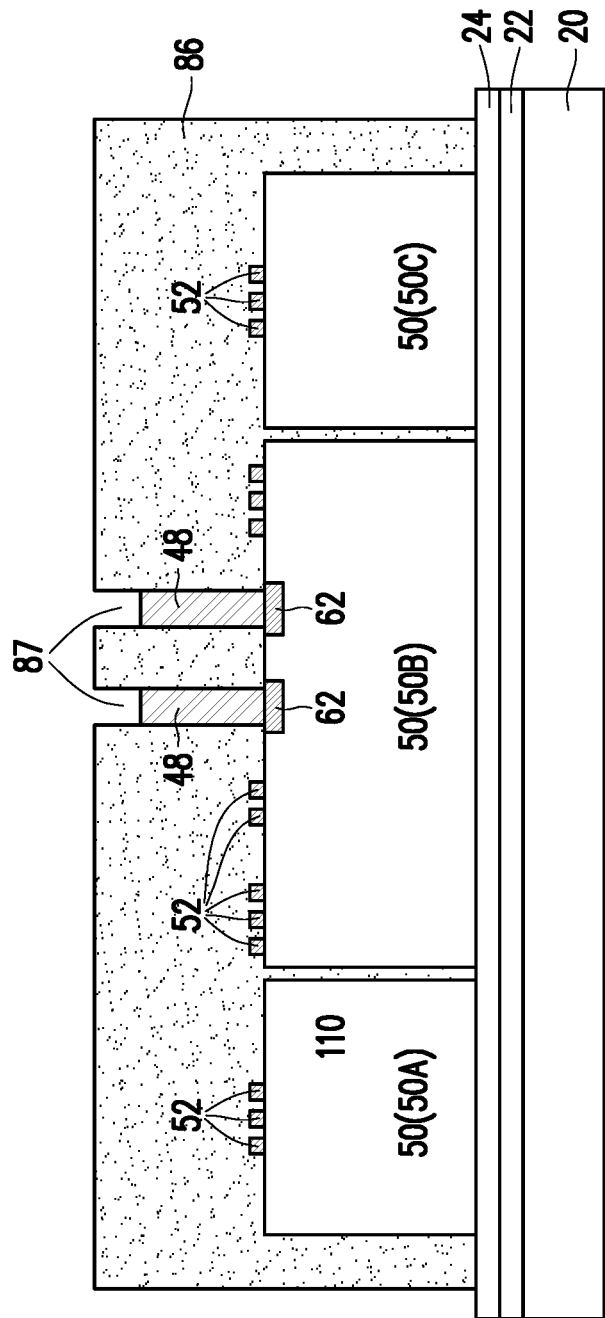
FIGS. 21 through 24 illustrate the cross-sectional views of intermediate stages in the formation of packages in accordance with some embodiments.

Referring to FIG. 21, package components 50 are placed over carrier 20 through release layer 22. The respective step is shown as step 402 in the process flow shown in FIG. 28. Dielectric buffer layer 24 may or may not be formed. Next, photo resist 86 is applied and then patterned. The respective step is shown as step 404 in the process flow shown in FIG. 28. Openings 87 are formed in photo resist 86, with some portions of metal pads 62 exposed. Next, a plating process is performed to form metal posts, which are also denoted as 48. The respective step is shown as step 406 in the process flow shown in FIG. 28. Since the plating is started from metal pads 62, no seed layer is needed, and the plating starts from metal pads 62. Photo resist 86 is then removed, for example, in an ashing process, and the resulting structure is shown in FIG. 22.

Figure 22:
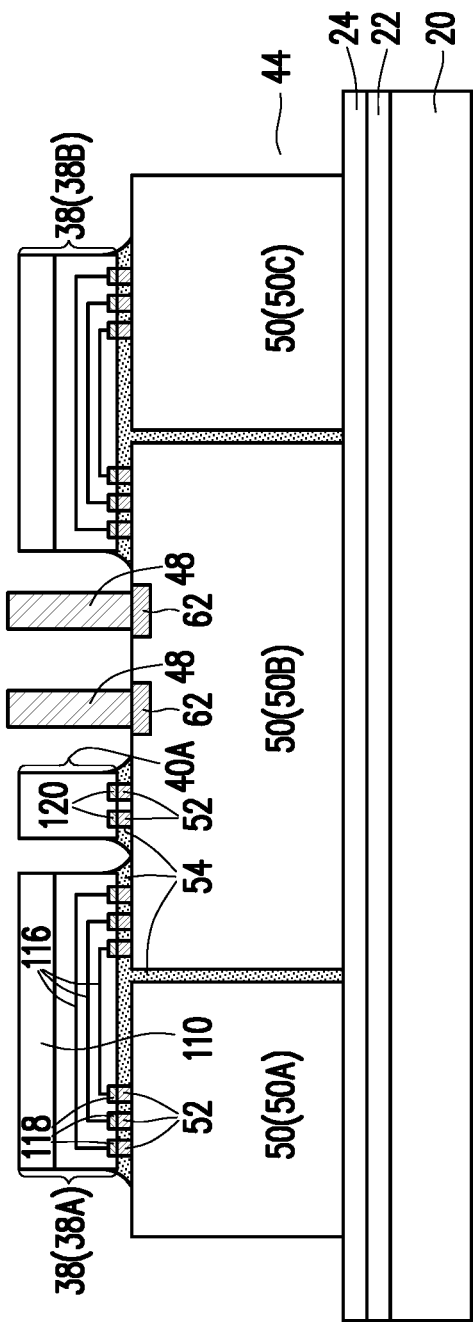

FIG. 22 further illustrates the bonding of interconnect dies 38 and IPD 40A to package components 50. The respective step is shown as step 408 in the process flow shown in FIG. 28. The structures, materials, and processes may be similar to what are shown in, and discussed referring to, FIG. 11. The details are thus no repeated herein. Underfill 54 is then dispensed to fill the gaps between IPD 40A, interconnect dies 38, and the respective underlying package components 50A, 50B, and 50C. Furthermore, underfill 54 may include some portions flowing into the gaps between neighboring package components 50A, 50B, and 50C. These portions of underfill 54 may be overlapped by the overlying interconnect dies 38. In accordance with some embodiments of the present disclosure, the bottom surfaces of underfill 54 may (or may not) be coplanar with the bottom surfaces of package components 50A, 50B, and 50C.

Figure 23:
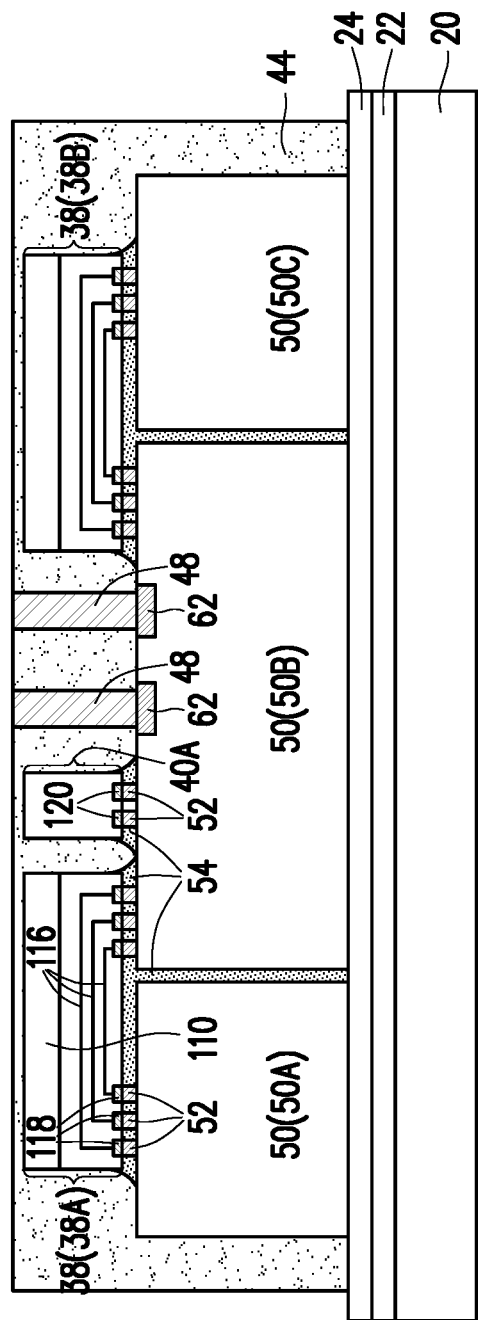

FIG. 23 illustrates an encapsulation process, with package components 50A, 50B, and 50C, interconnect dies 38, and IPD 40A being encapsulated in encapsulating material 44. The respective step is shown as step 410 in the process flow shown in FIG. 28. Encapsulating material 44 also includes lower portions at the same level as, and encircling, package components 50A, 50B, and 50C, and upper portions higher than or at the same level as, and encircling, interconnect dies 38 and IPD 40A. It is appreciated that the packaging process is at wafer level, and hence encapsulating material 44 encapsulates a plurality of bonded structures identical to the structure including package components 50A, 50B, and 50C, interconnect dies 38, and IPD 40A.

Figure 24:
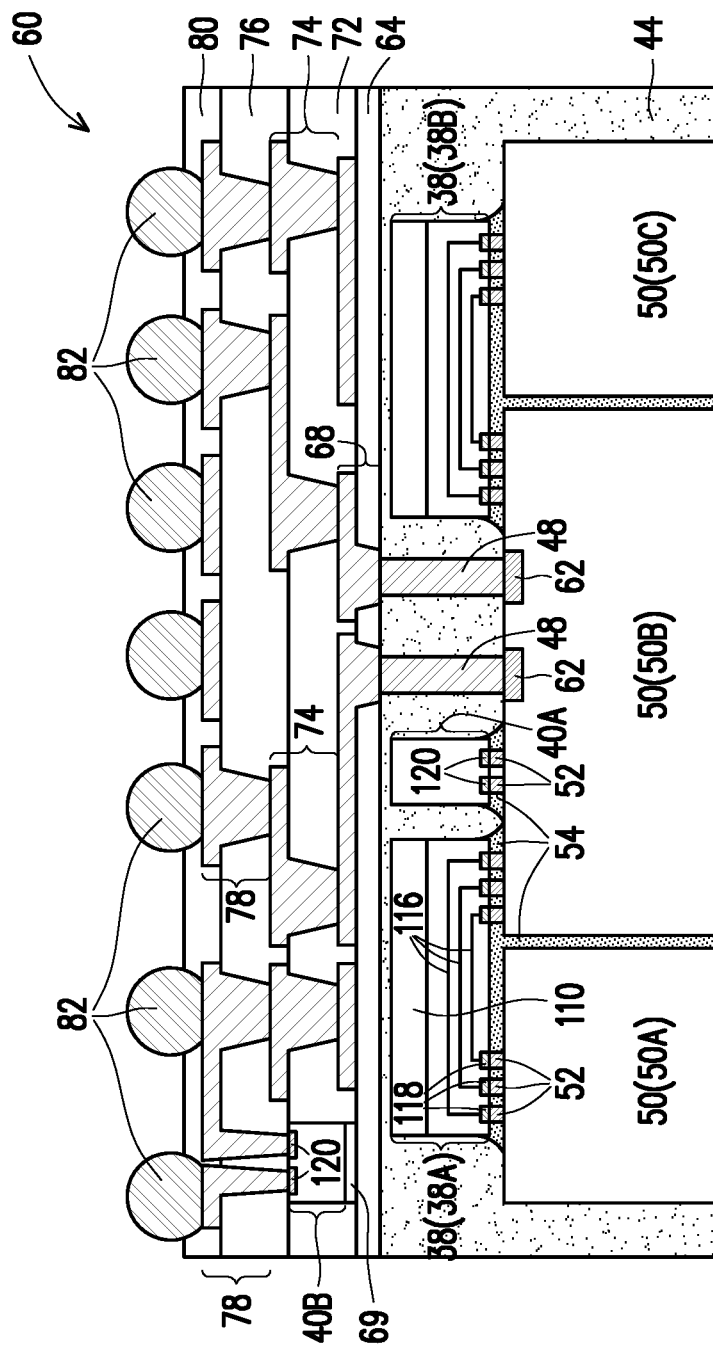

The process steps as shown in FIGS. 14 through 20 are then performed starting from the structure shown in FIG. 23. The respective step is shown as step 412 in the process flow shown in FIG. 28. The details (the materials, structures, and the formation processes) are essentially the same as shown and described referring to FIGS. 14 through 20, and are not repeated herein. The resulting package 60 is shown in FIG. 24.

FIG. 25 illustrates an exemplary embodiment in which package 60 is bonded to another package component 84 to form package 88. Package component 84 may be a package substrate, a printed circuit board, or the like. It is appreciated that although package 60 is shown to have the structure in FIG. 24, the packages 60 shown in FIGS. 9 and 20 may also be bonded to package component 84 similarly to form package 88. In accordance with some embodiments, some of the package components 50A, 50B, and 50C include packages or die stacks. For example, FIG. 25 schematically illustrates that package components 50A and 50C are die stacks including a plurality of device dies.

In above-illustrated exemplary embodiments, some exemplary processes and features are discussed in accordance with some embodiments of the present disclosure. Other features and processes may also be included. For example, testing structures may be included to aid in the verification testing of the three-dimensional (3D) packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By using interconnect dies to interconnect device dies (or other types of package components) that are placed at the same level, the conventional interposers are not needed. The RDLs may be used for connecting device dies to package substrate and/or printed circuit board, so that no through-silicon vias, which are used in interposers, are needed. The high cost associated with the formation of the interposers is thus saved. The interconnect dies may be formed using processes for forming device dies, and hence the pitches of the interconnections are small, making high-density interconnection possible.

In accordance with some embodiments of the present disclosure, method includes bonding a first device die and a second device die to an interconnect die. The interconnect die includes a first portion over and bonded to the first device die, and a second portion over and bonded to the second device die. The interconnect die electrically connects the first device die to the second device die. The method further includes encapsulating the interconnect die in an encapsulating material, and forming a plurality of redistribution lines over the interconnect die. In an embodiment, the method further includes forming a through-via penetrating through the encapsulating material to electrically connect the first device die to the plurality of redistribution lines. In an embodiment, the method further includes the forming the through-via comprises: removing a portion of the encapsulating material to form an opening, with a conductive pad of the first device die exposed to the opening; and filling a conductive material into the opening. In an embodiment, the method further includes the forming the through-via comprises: forming a patterned photo resist, wherein a conductive pad of the first device die is exposed through an opening in the patterned photo resist; plating the through-via in the opening; and removing the patterned photo resist, wherein the encapsulating material is encapsulated on the through-via after the patterned photo resist is removed. In an embodiment, the method further includes the plurality of redistribution lines is formed before the first device die and the second device die are bonded to the interconnect die. In an embodiment, the method further includes the plurality of redistribution lines is formed after the first device die and the second device die is bonded to the interconnect die. In an embodiment, the method further includes bonding an IPD to one of the first device die and the second device die.

In accordance with some embodiments of the present disclosure, method includes forming a dielectric layer over a carrier; forming a plurality of redistribution lines, with via portions of the plurality of redistribution lines penetrating through the dielectric layer; attaching an interconnect die to a surface of the plurality of redistribution lines through a die-attach film; encapsulating the interconnect die in an encapsulating material; and bonding a first package component and a second package component to the interconnect die, wherein the first package component is bonded to a first portion of the interconnect die, and the second package component is bonded to a second portion of the interconnect die. In an embodiment, the method further includes attaching an IPD to an additional surface of the plurality of redistribution lines through an additional die-attach film; and bonding the first package component to the IPD. In an embodiment, the method further includes forming a through-via penetrating through the encapsulating material, wherein the through-via is bonded to one of the first package component and the second package component. In an embodiment, the method further includes the interconnect die electrically connects the first package component to the second package component. In an embodiment, the method further includes the interconnect die comprises a substrate, and the interconnect die is free from through-substrate vias and active devices therein. In an embodiment, the method further includes the interconnect die is further free from passive devices therein. In an embodiment, the method further includes the die-attach film contacts top surfaces of two neighboring ones of the plurality redistribution lines, and wherein after the interconnect die is encapsulated in the encapsulating material, an air gap exists between the two neighboring ones of the plurality of redistribution lines.

In accordance with some embodiments of the present disclosure, a device includes a first device die and a second device die; an interconnect die comprising a first portion over and bonded to the first device die; and a second portion over and bonded to the second device die, wherein the interconnect die electrically connects the first device die to the second device die; an encapsulating material encapsulating the interconnect die therein; and a through-via penetrating through the encapsulating material to connect to the first device die. In an embodiment, the device further includes an integrated passive device bonded to one of the first device die and the second device die. In an embodiment, the device further includes an underfill comprising a first portion between the first device die and the interconnect die; and a second portion between the first device die and the second device die. In an embodiment, a top surface portion of the encapsulating material is over and in contact with a top surface of the interconnect die. In an embodiment, the device further includes a die-attach film over and contact a top surface of the interconnect die, wherein the die-attach film is in the encapsulating material. In an embodiment, the through-via is bonded to one of the first device die and the second device die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A package comprising:
an encapsulant comprising a first top surface;
an interconnect die in the encapsulant, wherein the interconnect die comprises:
  a plurality of electrical connectors; and
  a second top surface, wherein an entirety of the second top surface is planar, and wherein the second top surface is coplanar with the first top surface of the encapsulant;
a first die and a second die underlying the interconnect die and in the encapsulant, wherein the interconnect die electrically connects the first die to the second die, and wherein electrical connectors of the first die and the second die are bonded to some of the plurality of electrical connectors; and
an interconnect structure underlying the first die and the second die, wherein the interconnect structure comprises a plurality of redistribution lines, with some of the plurality of redistribution lines comprising a plurality of vias, and wherein the plurality of vias comprise a wider ends and narrower ends, and wherein the wider ends are closer to the interconnect die than respective ones of the narrower ends.

2. The package of claim 1 further comprising a die-attach film between, and contacting, the interconnect die and a first redistribution line in the interconnect structure.

3. The package of claim 2, wherein the die-attach film further contacts a second redistribution line in the interconnect structure.

4. The package of claim 3, wherein the die-attach film is exposed to an air gap between the first redistribution line and the second redistribution line.

5. The package of claim 2, wherein a first edge of the die-attach film is vertically aligned to a second edge of the interconnect die.

6. The package of claim 1 further comprising an integrated passive device bonded to one of the first die and the second die.

7. The package of claim 1 further comprising an underfill, wherein the underfill comprises:
 a first portion between the interconnect die and the first die; and
 a second portion between the first die and the second die.

8. The package of claim 1 further comprising an integrated passive device bonding to one of the first die and the second die, wherein the integrated passive device is in the encapsulant.

9. The package of claim 1, wherein the interconnect die is free from active devices therein.

10. A package comprising:
 a first device die comprising a first electrical connector and a second electrical connector;
 a second device die comprising a third electrical connector;
 an interconnect die underlying the first device die and the second device die, the interconnect die comprising:
  a fourth electrical connector bonding to the first electrical connector of the first device die;
  a fifth electrical connector bonding to the third electrical connector of the second device die; and
  an electrical path in the interconnect die, wherein the electrical path electrically connects the fourth electrical connector to the fifth electrical connector;
 an interconnect structure underlying the interconnect die, wherein the interconnect structure comprises a redistribution line; and
 a through-via electrically connecting the interconnect structure to the second electrical connector, wherein the through-via comprises a top end and a bottom end, and wherein the top end is wider than the bottom end.

11. The package of claim 10, wherein the redistribution line comprises a via, and upper portions of the via are wider than respective lower portions of the via.

12. The package of claim 10 further comprising a die-attach film adhering the interconnect die to the redistribution line.

13. The package of claim 12 further comprising an air gap, wherein both of the die-attach film and the redistribution line are exposed to the air gap.

14. The package of claim 10 further comprising:
 an integrated passive device bonding to the second device die; and
 an additional die-attach film, wherein the integrated passive device is attached to the additional die-attach film.

15. A package comprising:
 a plurality of device dies;
 an interconnect die, wherein the interconnect die electrically connects a first device die to a second device die in the plurality of device dies;
 an interconnect structure comprising a plurality of redistribution lines, wherein the plurality of redistribution lines are distributed in a plurality of conductive layers, and wherein the interconnect die is free from active devices and passive devices therein;
 a through-via between, and is in physical contact with both of, the first device die and a redistribution line in the plurality of redistribution lines; and
 an independent passive device bonding to the first device die, wherein the independent passive device is located between the first device die and the interconnect structure.

16. The package of claim 15 further comprising:
 a die-attach film between and contacting the interconnect die and one of the plurality of redistribution lines.

17. The package of claim 15 further comprising an encapsulant, wherein the through-via penetrates through the encapsulant.

18. The package of claim 15 further comprising an encapsulant, with the device die and the through-via being in the encapsulant, and wherein the independent passive device is separated from the interconnect structure by a portion of the encapsulant.

* * * * *